United States Patent [19]
Hosokawa

[11] Patent Number: 6,016,564
[45] Date of Patent: Jan. 18, 2000

[54] METHOD OF DESIGN FOR TESTABILITY, METHOD OF DESIGN FOR AVOIDING BUS ERROR AND INTEGRATED CIRCUIT

[75] Inventor: Toshinori Hosokawa, Osaka, Japan

[73] Assignee: Matsushita Electric Industrial Co., Ltd., Osaka, Japan

[21] Appl. No.: 08/917,555

[22] Filed: Aug. 26, 1997

[30] Foreign Application Priority Data

Aug. 28, 1996 [JP] Japan .................................. 8-226806

[51] Int. Cl.⁷ .................................................. H04B 17/00
[52] U.S. Cl. .......................................... 714/726; 714/724
[58] Field of Search ................................ 714/726, 727, 714/724

[56] References Cited

U.S. PATENT DOCUMENTS

| | | | |
|---|---|---|---|
| 5,329,533 | 7/1994 | Lin | 714/726 |
| 5,515,517 | 5/1996 | Nozuyama et al. | 395/325 |
| 5,646,422 | 7/1997 | Hashizume | 257/48 |

*Primary Examiner*—Phung M. Chung
*Attorney, Agent, or Firm*—McDermott, Will & Emery

[57] ABSTRACT

The invention provides a method of design for testability of a fault in a portion difficult to test such as an enable input of a tristate element. With regard to an integrated circuit design by a scan path method, an observation circuit including an EXOR tree having inputs in the number equal to that of tristate elements to be designed for testability and an observation dedicated scan FF is disposed. The enable inputs of the tristate elements are connected with the input terminals of the EXOR tree, and the output terminal of the EXOR tree is connected with the ordinary data input terminal of the observation dedicated scan FF. Furthermore, the observation scan FF is inserted into a scan chain already formed by the scan path method. In this manner, a fault in logic circuits for controlling the enable input of the tristate elements, which are conventionally difficult to be detected, can be observed at an external output pin through the scan chain.

18 Claims, 19 Drawing Sheets

| EN | DIN | DOUT |
|----|-----|------|
| 1  | 0   | 0    |
| 1  | 1   | 1    |
| 0  | X   | Z    |

METHOD OF DESIGN FOR TESTABILITY, METHOD OF DESIGN FOR AVOIDING BUS ERROR AND INTEGRATED CIRCUIT

BACKGROUND OF THE INVENTION

The present invention relates to a method of design for testability and a method of design for avoiding a bus error for use in an integrated circuit.

In recent design of an integrated circuit, a tristate element is often used.

FIGS. 19(a) and 19(b) illustrate a tristate element, wherein FIG. 19(a) is a symbol standing for a tristate element in a logic circuit diagram and FIG. 19(b) is a truth table for showing the operation of the tristate element. As is shown in FIG. 19(a), the tristate element has an enable input EN in addition to a data input DIN and a data output DOUT. As is shown in FIG. 19(b), the tristate element has a function to switch, in accordance with the enable input EN, between a mode for allowing an input data to pass through to be directly output and a mode for not outputting the input data but placing the output terminal at a high impedance state. Specifically, when the enable input EN is "1", the data output DOUT is equal to the data input DIN, and when the enable input EN is "0", the data output DOUT is "Z" (namely, at the high impedance state) regardless of the logic value of the data input DIN. Hereinafter, switching of the tristate element to the mode for allowing the input data to pass through to be directly output is designated as the tristate element being turned on, and switching of the tristate element to the mode for not outputting the input data but placing the output terminal at the high impedance state is designated as the tristate element being turned off.

Any particular method of design for testability for use in a circuit designed by a scan path method and including a tristate element has not been conventionally proposed, and a circuit manufacturer has recommended design not including a tristate element to a circuit designer.

However, there conventionally arise the following problems:

First, in the conventional circuit designed by a scan path method and including a tristate element, a fault of the enable input of the tristate element cannot be detected.

For example, in order to detect the stuck-at fault on an enable input EN, the enable input EN must be set to "0"and the signal value of the data output DOUT must be observed. However, the stuck-at fault on the enable input EN cannot be detected if the data output DOUT does not connect with any external output pins of the LSI.

Furthermore, the faults in a logic circuit controlling the enable input alone cannot be detected. As a result, a fault coverage of the integrated circuit cannot be disadvantageously improved.

Also, in the case where the data outputs of plural tristate elements are connected with a common bus, there is a possibility of occurrence of a bus error such as a bus conflict due to different output data of the respective tristate elements and a bus float due to all the output terminals of the tristate elements being placed in the high impedance state. In order to avoid such a bus error, it is necessary, in testing the integrated circuit, to control the enable inputs of the respective tristate elements so that merely one of the tristate elements connected with the common bus can be in an on-state.

However, in such a case, a fault of the data inputs of the tristate elements which are not in an on-state during the test cannot be detected. In addition, faults in logic circuits connected with these data inputs alone cannot be detected. As a result, the fault coverage of the integrated circuit cannot be disadvantageously improved.

SUMMARY OF THE INVENTION

The object of the invention is attaining testability of a fault of a portion difficult to test such as an enable input and a data input of a tristate element or a fault of a portion impossible to test in a method of design for testability of an integrated circuit.

The method of design for testability of an integrated circuit of this invention comprises a first step of designing the integrated circuit by a scan path method for attaining testability fully; a second step of adding an observation circuit, which observes a signal at a portion difficult to test or a portion impossible to test and outputs the observed signal from an observation dedicated scan flip-flop, to the integrated circuit; and a third step of inserting the observation dedicated scan flip-flop into a scan chain formed in the first step so that an output signal of the observation circuit is outputted from the integrated circuit through the scan chain.

According to the method of design for testability of this invention, the integrated circuit is designed by the scan path method in the first step, and the observation circuit which observes the signal at the portion difficult to test or the portion impossible to test and outputs the observed signal from the observation dedicated scan flip-flop is added to the integrated circuit in the second step. Then, in the third step, the observation dedicated scan flip-flop is inserted into the scan chain formed by the scan path method. As a result, a fault of the portion difficult to test such as an enable input of a tristate element or a fault of the portion impossible to test can be observed from an external output terminal of the integrated circuit through the scan chain formed by the scan path method. Accordingly, a fault coverage of the integrated circuit can be improved. In addition, there is no need to additionally provide an external output pin for observing the output signal of the observation circuit.

The observation circuit preferably includes a combinational circuit which receives plural signals of portions difficult to test or impossible to test as its input signals and outputs an output signal to the observation dedicated scan flip-flop, and the output signal of the combinational circuit is preferably changed in accordance with a change of one of the input signals.

Thus, since signals of plural portions difficult to test or impossible to test can be observed through one observation dedicated flip-flop, increase of over-head resulting from the design for testability can be suppressed.

Furthermore, the combinational circuit is preferably an EXOR tree including one exclusive OR gate or plural exclusive OR gates connected with one another in a tree-shape.

The portion difficult to test is preferably an enable input line of a tristate element. Alternatively, the portion difficult to test is preferably a data input line of a tristate element which is in an off-state where no input data is output during a test of the integrated circuit.

In the third step, the observation dedicated scan flip-flop is preferably inserted so as not to increase the maximum of the numbers of scan flip-flops included in respective scan chains. Alternatively, in the third step, the observation dedicated scan flip-flop is preferably inserted so as to equalize the numbers of scan flip-flops included in the respective scan chains.

Thus, since the number of test patterns required for testing the integrated circuit designed by the scan path method depends upon the maximum number of the scan flip-flops included in the respective scan chains, the fault coverage of the integrated circuit can be improved without increasing the number of the test patterns required for the test or with minimizing the increase of the number of the test patterns required for the test.

The integrated circuit of this invention is designed by a scan path method and has a scan chain including an observation dedicated scan flip-flop operated merely during a test of the integrated circuit.

The observation dedicated scan flip-flop preferably receives, as its input signal, an enable input signal of a tristate element. Alternatively, the observation dedicated scan flip-flop preferably receives, as its input signal, a data input signal of a tristate element which is in an off-state where no input data is output during a test of the integrated circuit.

The observation dedicated scan flip-flop preferably receives, as its input signal, an output signal of a combinational circuit having plural inputs and one output, and the output signal of the combinational circuit is preferably changed in accordance with a change of one input signal.

Furthermore, the combinational circuit is preferably an EXOR tree including one exclusive OR gate or plural exclusive OR gates connected with one another in a tree-shape.

The combinational circuit preferably receives, as its input signal, an enable input signal of a tristate element. Alternatively, the combinational circuit preferably receives, as its input signal, a data input signal of a tristate element which is in an off-state where no input data is output during a test of the integrated circuit.

The method of design for avoiding a bus error of this invention in which an integrated circuit designed by a scan path method is modified in its design for preventing a bus error, comprises a first process for distinguishing whether or not an enable input of a tristate element included in the integrated circuit is controlled by a scan flip-flop and for extracting, from the integrated circuit, a bus connected with data output terminals of plural tristate elements whose enable inputs are controlled by scan flip-flops; a second process for generating, with regard to the plural tristate elements whose data output terminals are connected with the bus extracted in the first process, a selection circuit for receiving output data of the scan flip-flops controlling the enable inputs of the plural tristate elements and for controlling the enable inputs of the plural tristate elements so that merely one of the plural tristate elements is in an on-state where input data is passed through to be output during a test of the integrated circuit; and a third process for disposing the selection circuit generated in the second process in the integrated circuit and for connecting an output terminal of the selection circuit with the enable input terminals of the plural tristate elements, and in this method, the selection circuit generated in the second process receives, as its input signals, positive output data and negative output data of the scan flip-flops controlling the enable inputs of the plural tristate elements.

According to the method of design for avoiding a bus error, with regard to the plural tristate elements whose data output terminals are connected with the common bus, the selection circuit for controlling the enable inputs of the plural tristate elements is added so that merely one of the tristate elements can be in an on-state where the input data is passed through to be output. As a result, a bus error possibly occurring during a test of the integrated circuit can be prevented.

BRIEF DESCRIPTION OF THE DRAWINGS

FIGS. 3(a) and 3(b) illustrate the method of design for testability according to the first embodiment, wherein FIG. 3(a) is a circuit diagram of a circuit to be designed by the method of design for testability and FIG. 3(b) is a circuit diagram of a circuit obtained from the circuit of FIG. 3(a) by the method of design for testability;

FIGS. 14(a) and 14(b) illustrate the method of design for testability of the invention adopted for detecting an untestable fault or an undetected fault, wherein FIG. 14(a) is a circuit diagram of an exemplified circuit having an untestable fault and FIG. 14(b) is a circuit diagram obtained from the circuit of FIG. 14(a) by the method of design for testability;

FIGS. 17(a) and 17(b) illustrate the method of design for avoiding a bus error of the fifth embodiment, wherein FIG. 17(a) is a circuit diagram of a circuit having a possibility of occurrence of a bus error and FIG. 17(b) is a circuit diagram of a circuit obtained from the circuit of FIG. 17(a) by the method of design for avoiding a bus error;

FIGS. 18(a) and 18(b) illustrate a conventional method of design for avoiding a bus error, wherein FIG. 18(a) is a circuit diagram of a circuit resulting from conventional design for avoiding a bus error and FIG. 18(b) is a timing chart of a clock and a signal NT supplied to a scan FF in the circuit of FIG. 18(a); and FIGS. 19(a) and 19(b) illustrate a tristate element, wherein FIG. 19(a) is a symbol standing for the tristate element used in a logic circuit diagram and FIG. 19(b) is a truth table for showing the operation of the tristate element.

DETAILED DESCRIPTION OF THE INVENTION

Figure 1:
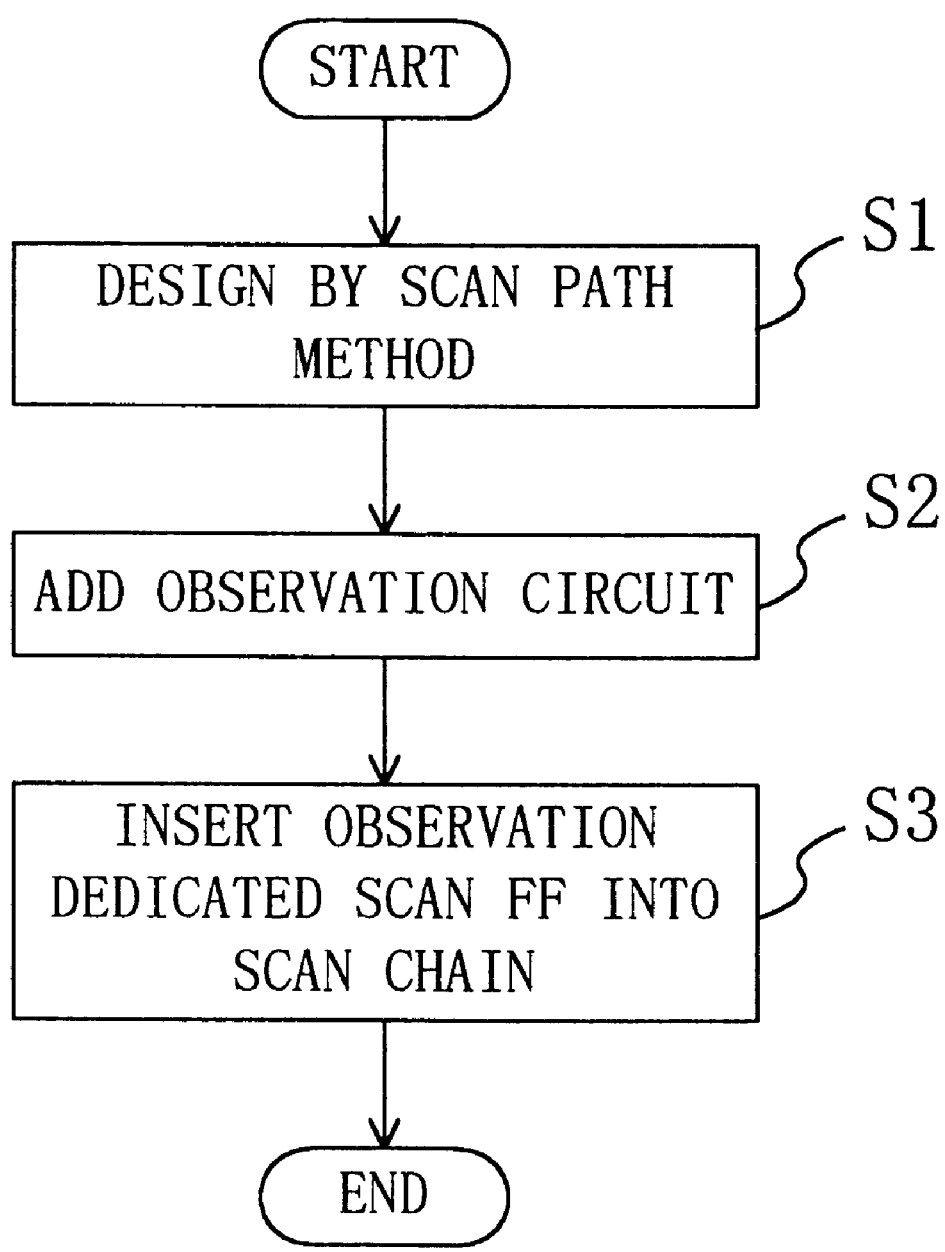
FIG. 1 is a flowchart for showing the outline of a method of design for testability according to the invention.

FIG. 1 is a flowchart for showing the outline of a method of design for testability according to the present invention. The method of design for testability of this invention comprises, as is shown in FIG. 1, a first step S1 of designing a given integrated circuit by a scan path method for attaining testability, a second step S2 of adding an observation circuit, which observes a signal at a portion difficult to test and outputs the observed signal from an observation dedicated scan flip-flop, to the integrated circuit designed in the first step S1, and a third step S3 of inserting the observation dedicated scan flip-flop (observation dedicated scan FF) into a scan chain formed in the first step S1 so that an output signal of the observation circuit added in the second step S2 can be output from the integrated circuit through the scan chain.

The first step S1 is carried out by the conventionally well-known scan path method. The method of design for testability of this invention is characterized by further modifying the design of the integrated circuit obtained by the scan path method in the first step S1 through the second and third steps S2 and S3, so as to improve a fault coverage.

Now, embodiments of the method of design for testability of this invention will be described with reference to the accompanying drawings.

(Embodiment 1)

In a first embodiment of the invention, an integrated circuit including a tristate element and designed by the scan path method is modified in its design so as to detect faults in a logic circuit for controlling the enable input of the tristate element.

Figure 2:
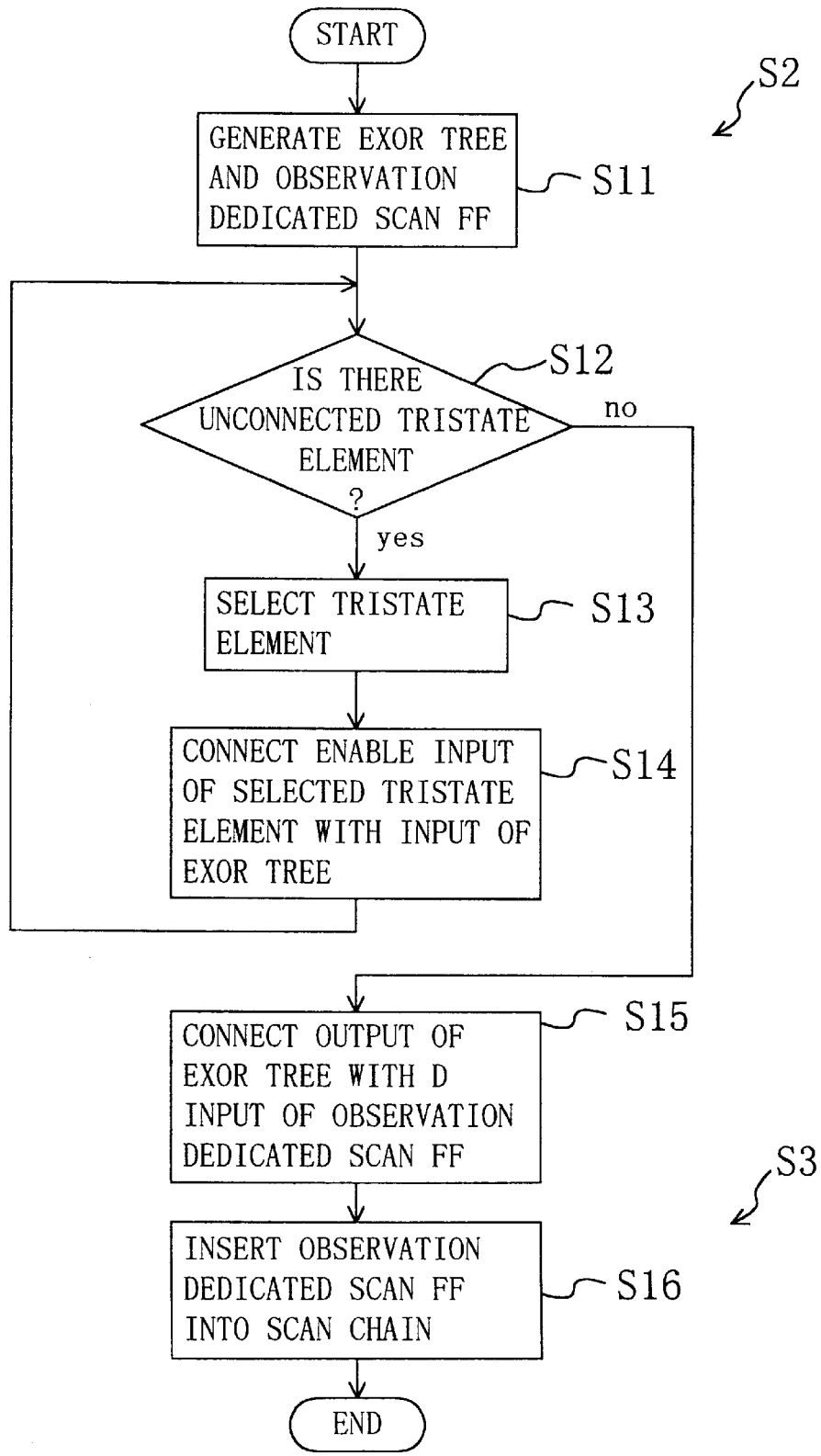
FIG. 2 is a flowchart for showing procedures in a method of design for testability according to a first embodiment of the invention.

FIG. 2 is a flowchart for showing procedures in a method of design for testability of this embodiment, and these procedures correspond to the second and third steps S2 and S3. Steps S11 through S15 constitute the second step S2, and a step S16 constitutes the third step S3.

First, in the step S11, with regard to a given integrated circuit, an EXOR tree having inputs in the number equal to that of all tristate elements included in the integrated circuit and one observation dedicated scan FF are generated as an observation circuit. At this point, the EXOR tree includes one exclusive OR (EXOR) circuit or plural EXOR circuits connected in a tree-shape.

Then, in the step S12, it is distinguished whether or not the integrated circuit includes a tristate element not connected with any of the inputs of the EXOR tree generated in the step S11. When the integrated circuit includes such a tristate element, the procedure proceeds to the step S13, and when not, the procedure proceeds to the step S15.

In the step S13, one tristate element not connected with any of the inputs of the EXOR tree is selected. Then, in the step S14, the enable input of the tristate element selected in the step S13 is connected with one input of the EXOR tree generated in the step S11. By repeating the procedures of the steps S12 through S14, the enable inputs of all the tristate elements in the integrated circuit are connected with the inputs of the EXOR tree generated in the step S11.

In the step S15, the output of the EXOR tree generated in the step S11 is connected with the ordinary data input of the observation dedicated scan FF generated in the step S11. Then, in the step S16, the observation dedicated scan FF is inserted into an arbitrary position in a scan chain already formed in the first step S1.

The method of design for testability of this embodiment will now be described in detail by exemplifying a simple circuit.

Figure 3A:
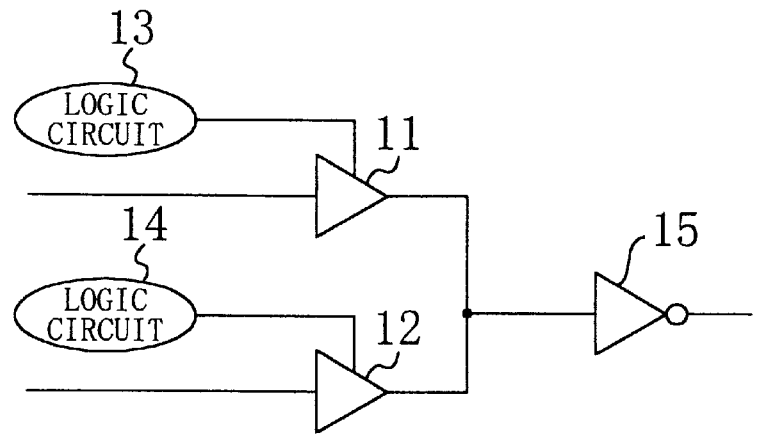
Figure 3B:
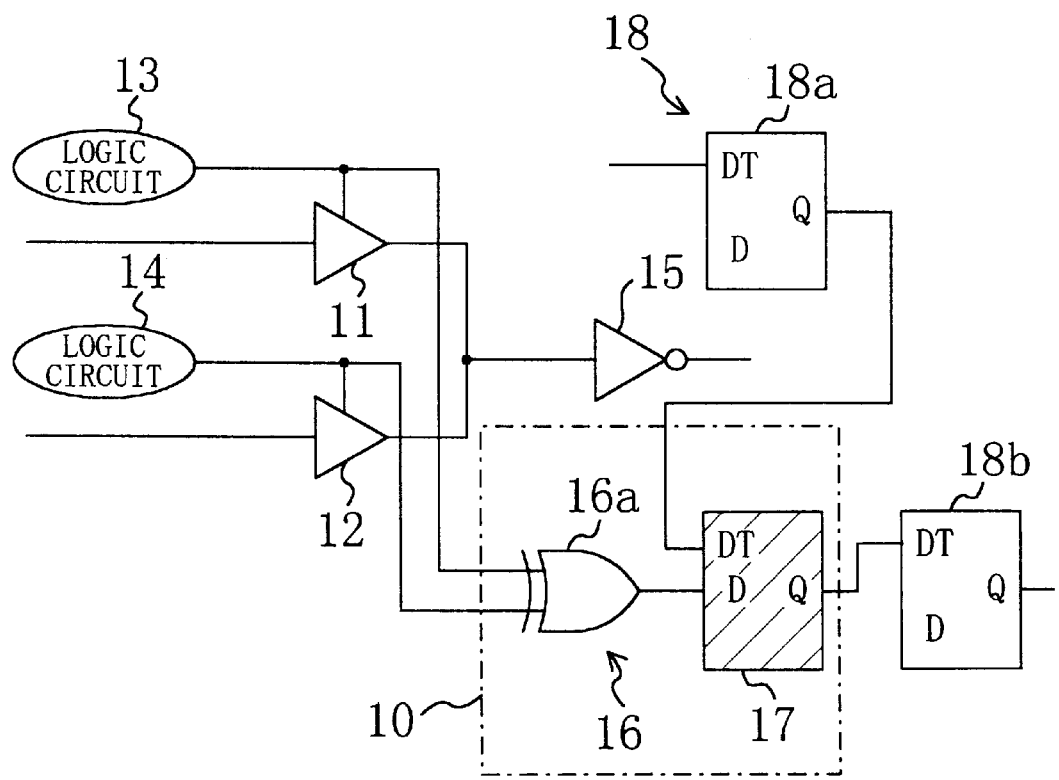

FIGS. 3(a) and 3(b) are diagrams for illustrating the method of design for testability of this embodiment, wherein FIG. 3(a) is a circuit diagram of a circuit to be designed for testability and FIG. 3(b) is a circuit obtained from the circuit of FIG. 3(a) by the method of design for testability of this embodiment.

In FIG. 3(a), reference numerals 11 and 12 denote tristate elements, reference numerals 13 and 14 denote logic circuits for controlling the enable inputs of the tristate elements 11 and 12, respectively, and a reference numeral 15 denotes an inverter.

With regard to the circuit of FIG. 3(a), first in the step S11, an observation circuit 10 including an EXOR tree 16 and an observation dedicated scan FF 17 is generated. Since the circuit of FIG. 3(a) includes the two tristate elements 11 and 12, the EXOR tree 16 has two inputs. In other words, the EXOR tree 16 is constituted by one EXOR gate 16a.

Next, in the steps S12 through S14, the enable inputs of the tristate elements 11 and 12 are connected with the inputs of the EXOR tree 16, and in the step S15, the output of the EXOR tree 16 is connected with the ordinary data input D of the observation dedicated scan FF 17.

Ultimately, in the step S16, the observation dedicated scan FF 17 is inserted into an existing scan chain 18 including scan FFs 18a and 18b. As is shown in FIG. 3(b), the output Q of the scan FF 18a is disconnected from the test data input DT of the scan FF 18b, the output Q of the scan FF 18a is connected with the test data input DT of the observation dedicated scan FF 17, and the output Q of the observation dedicated scan FF 17 is connected with the test data input DT of the scan FF 18b.

In the circuit of FIG. 3(b) thus modified in its design, faults in the logic circuits 13 and 14 can be observed at an external output pin through the observation dedicated scan FF 17 and the scan chain 18.

Figure 4A:
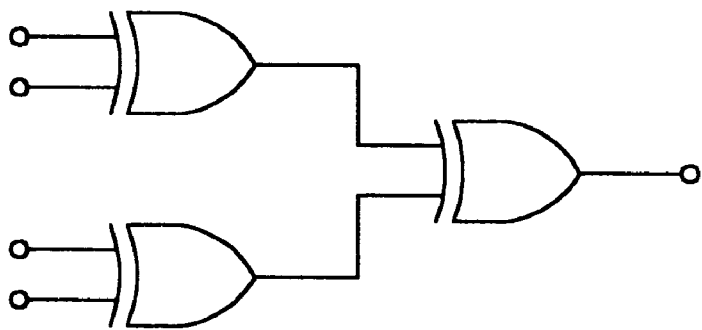
FIGS. 4(a) and 4(b) show examples of the structure of an EXOR tree.
Figure 4B:
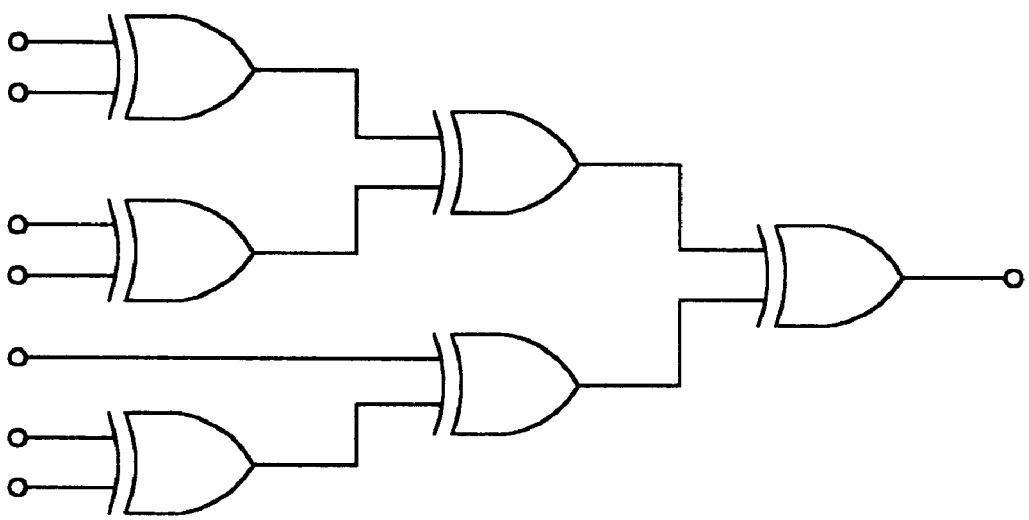

FIGS. 4(a) and 4(b) show other examples of the EXOR tree adoptable in the observation circuit of this embodiment. FIG. 4(a) is a 4-input EXOR tree including three EXOR gates, and FIG. 4(b) is a 7-input EXOR tree including six EXOR gates.

As described above, according to the method of design for testability of the first embodiment of the invention, the enable inputs of the tristate elements in the integrated circuit are connected with the inputs of the EXOR tree, and the output of the EXOR tree is connected with the existing scan chain through the observation dedicated scan FF. Thus, a fault in the logic circuits for controlling the enable inputs of the tristate elements alone, which cannot be conventionally detected, can be observed from the external output pin. As a result, the fault coverage of the integrated circuit can be improved.

(Modification of Embodiment 1)

In the first embodiment, the observation circuit is formed by using the EXOR tree, but the observation circuit can be formed by using a combinational circuit having plural inputs and one output instead of the EXOR tree. In a method of design for testability according to this modification, the observation circuit is formed by using a NAND tree including NAND gates.

Figure 5:
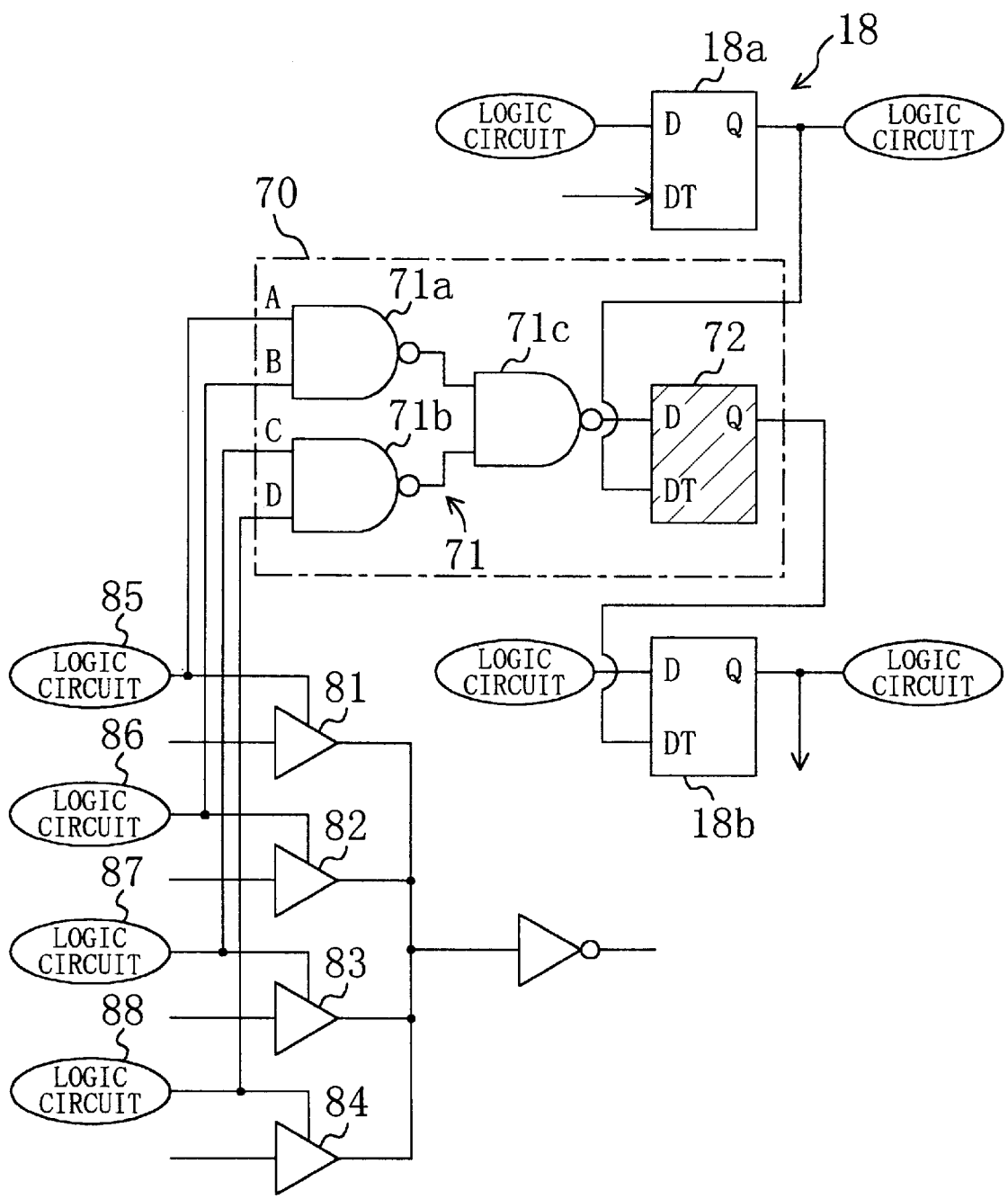
FIG. 5 is a circuit diagram of a circuit resulting from design for testability carried out by a method of design for testability according to a modification of the first embodiment.

FIG. 5 is a circuit diagram of a circuit obtained through the design for testability by the method of design for testability according to this modification. In FIG. 5, an observation circuit 70 for observing the enable inputs of tristate elements 81 through 84 is constituted by a NAND tree 71 including NAND gates 71a through 71c and an observation dedicated scan FF 72.

In the circuit of FIG. 5, when the enable input of, for example, the tristate element 81 is to be observed by the observation circuit 70, it is necessary to set the enable input signal of the tristate element 82 at "1" and the enable input signals of the tristate elements 83 and 84 at "0". In other words, the enable input of the tristate element 81 can be observed by the observation circuit 70 including the NAND tree 71 merely when the output signal of a logic circuit 86 can be set at "1" and the output signals of logic circuits 87 and 88 can be set at "0" in the integrated circuit.

The combinational circuit having plural inputs and one output used in the observation circuit is required to have an output signal changed in accordance with a change of one input signal, namely, to have an output controlled by a change of one input. The EXOR tree of the first embodiment and the NAND tree of this modification are the same in being the combinational circuit having plural inputs and one output that is controlled by a change of one input. However, in the EXOR tree, the output is controlled by the change of one input regardless of the values of other inputs, whereas the output can be controlled by the change of one input merely when the other inputs have a predetermined value in the NAND tree as described above. Therefore, the EXOR tree can be adopted without being restricted by the configuration of the integrated circuit, and is more generally used than the other combinational circuits such as the NAND tree. On the other hand, since a NAND gate has a simple configuration at a transistor level as compared with an EXOR gate, the NAND tree has a smaller circuit area than the EXOR tree, and hence is suitable to suppress increase of over-head resulting from the design for testability.

It is noted that any combinational circuit having plural inputs and one output that is controlled by the change of one input can be used in the observation circuit in stead of the EXOR tree or the NAND tree.

(Embodiment 2)

In a second embodiment of this invention, an integrated circuit designed by the scan path method and including tristate elements is modified in its design so as to detect a fault in a logic circuits controlling the enable inputs of the tristate elements, similarly to the first embodiment.

Figure 6:
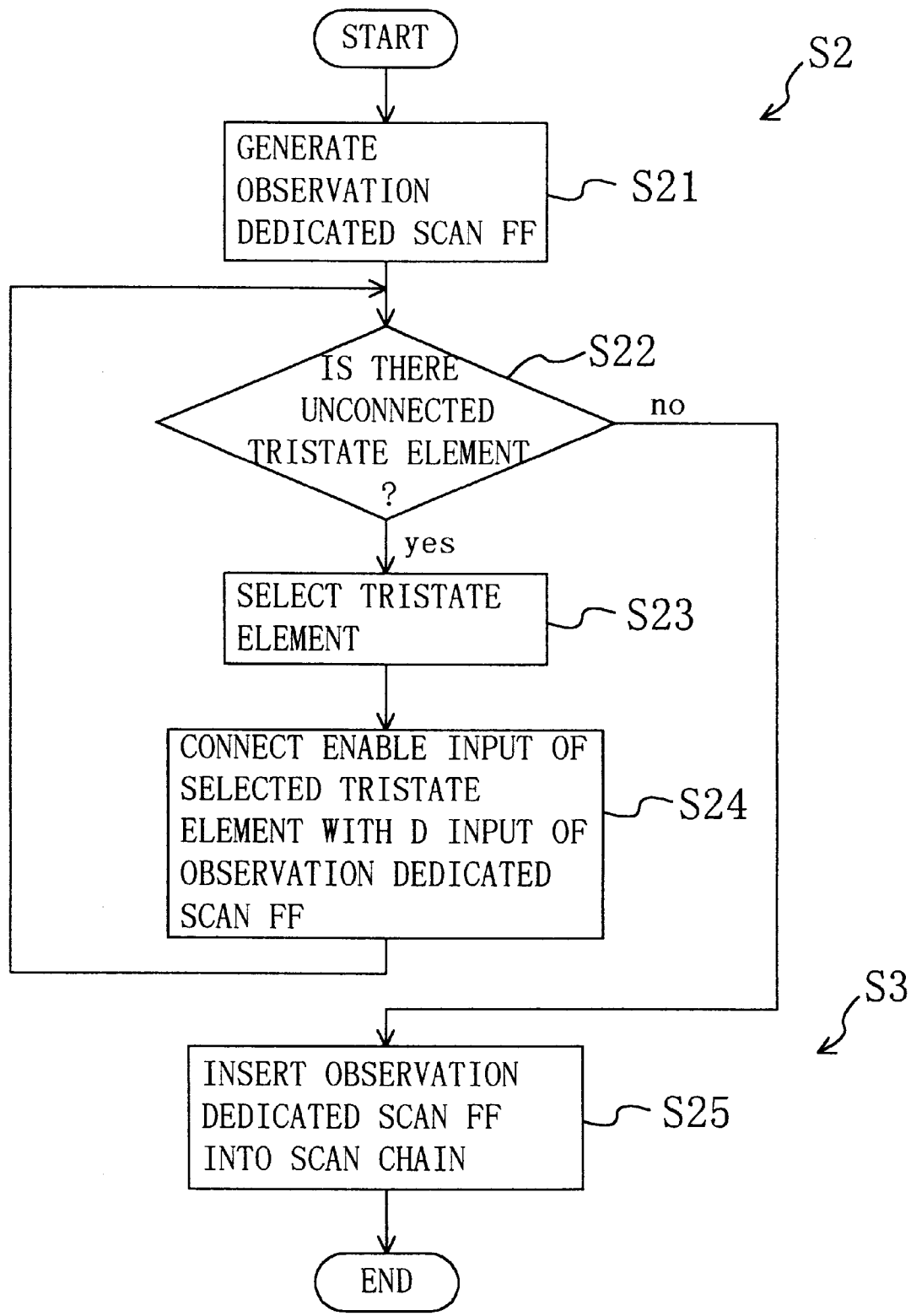
FIG. 6 is a flowchart for showing procedures in a method of design for testability according to a second embodiment of the invention.

FIG. 6 is a flowchart for showing procedures in a method of design for testability according to this embodiment, and these procedures correspond to the second and third steps S2 and S3. Steps S21 through S24 constitute the second step S2, and a step S25 constitutes the third step S3.

First, in the step S21, with regard to a given integrated circuit, observation dedicated scan FFs in the number equal to the number of all tristate elements included in the integrated circuit are generated as an observation circuit.

Then, in the step S22, it is distinguished whether or not the integrated circuit includes a tristate element not connected with any of the observation dedicated scan FFs generated in the step S21. When the integrated circuit includes such a tristate element, the procedure proceeds to the step S23, and when not, the procedure proceeds to the step S25.

In the step S23, one tristate element not connected with any of the observation dedicated scan FFs generated in the step S21 is selected. Then, in the step S24, the enable input of the tristate element selected in the step S23 is connected with the ordinary data input of one of the observation dedicated scan FFs generated in the step S21 not connected with any tristate element. By repeating the procedures of the steps S22 through S24, the enable inputs of all the tristate elements included in the integrated circuit are connected with the ordinary data inputs of the respective observation dedicated scan FFs generated in the step S21.

In the step S25, the observation dedicated scan FFs are inserted into an arbitrary position in a scan chain already formed in the first step S1.

Now, the method of design for testability of this embodiment will be described in detail by exemplifying a simple circuit.

Figure 7:
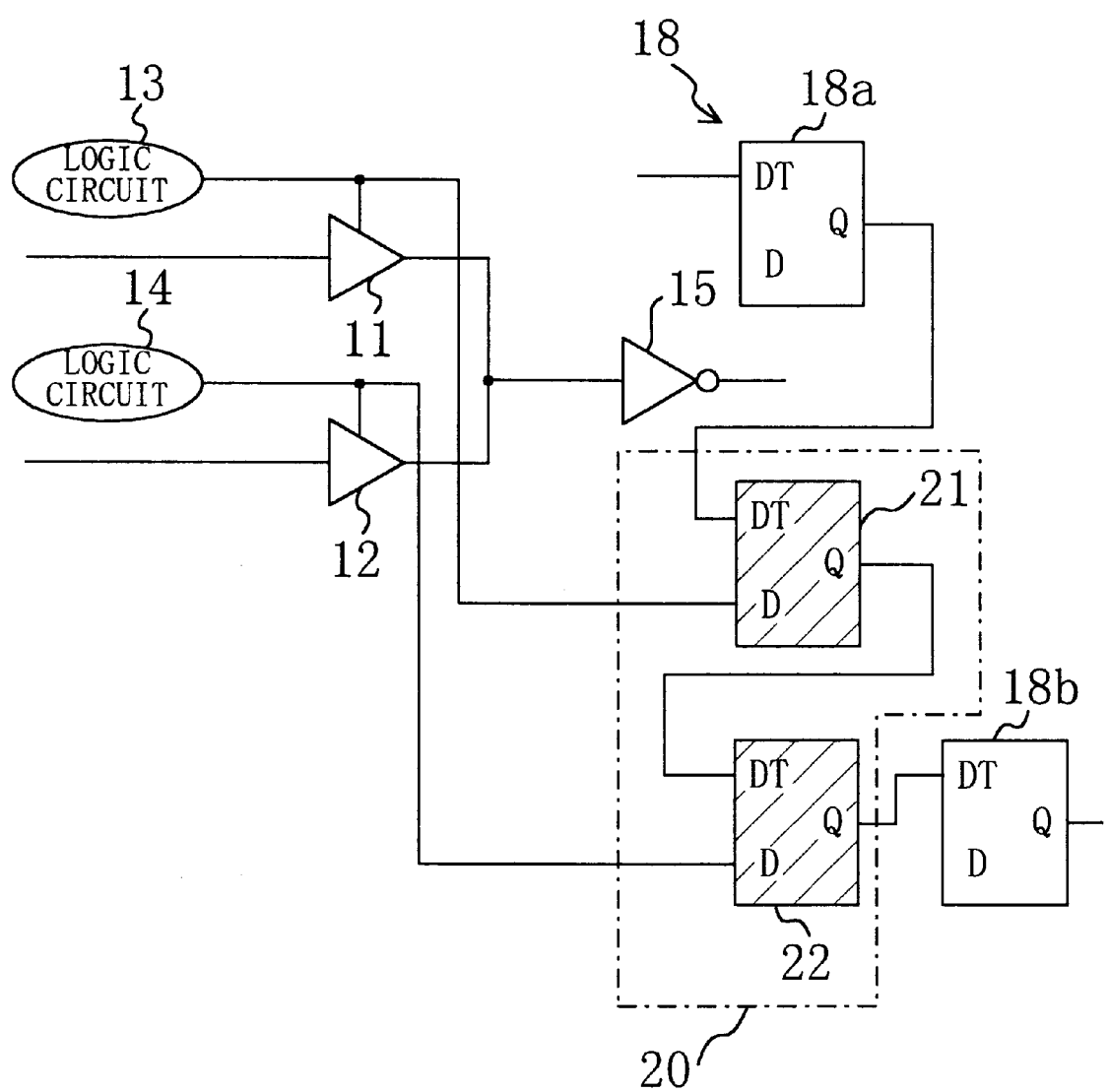
FIG. 7 illustrates the method of design for testability according to the second embodiment and is a circuit diagram of a circuit obtained from the circuit of FIG. 3(a) by the method of design for testability according to the second embodiment.

FIG. 7 is a diagram for illustrating the method of design for testability of this embodiment, and shows a circuit obtained from the circuit of FIG. 3(a) through the design for testability by the method of design for testability of this embodiment.

With regard to the circuit of FIG. 3(a), first in the step S21, an observation circuit 20 including observation dedicated scan FFs 21 and 22 is generated. At this point, the circuit of FIG. 3(a) includes two tristate elements 11 and 12, and hence, the two observation dedicated scan FFs 21 and 22 are generated.

Next, in the steps S22 through S24, the enables inputs of the tristate elements 11 and 12 are connected with the ordinary data inputs D of the observation dedicated scan FFs 21 and 22, respectively.

Then, in the step S25, the observation dedicated scan FFs 21 and 22 are inserted into an existing scan chain 18 including scan FFs 18a and 18b. As is shown in FIG. 7, the output Q of the scan FF 18a is disconnected from the test data input DT of the scan FF 18b, the output Q of the scan FF 18a is connected with the test data input DT of the observation dedicated scan FF 21, the output Q of the observation dedicated scan FF 21 is connected with the test data input DT of the observation dedicated scan FF 22, and the output Q of the observation dedicated scan FF 22 is connected with the test data input DT of the scan FF 18b.

In the circuit of FIG. 7 thus modified in its design, a fault in the logic circuits 13 and 14 can be observed from an external output pin through the observation dedicated scan FFs 21 and 22 and the scan chain 18.

As described above, according to the method of design for testability of the second embodiment, the enable inputs of the tristate elements included in the integrated circuit are connected with the ordinary data inputs of the observation dedicated scan FFs, so that a fault in the logic circuits controlling the enable inputs of the tristate elements alone, which cannot be conventionally detected, can be observed at the external output pin. As a result, the fault coverage of the integrated circuit can be improved.

In the first and second embodiments, all the tristate elements included in the integrated circuit are modified for testability, but merely a part of the tristate elements in the integrated circuit can be modified.

It is noted that the first and second embodiments can be combined as follows: A part of the observation circuit is formed by using a combinational circuit having plural inputs and one output, such as an EXOR tree, and the other part of the observation circuit is formed by directly connecting the observation dedicated scan FFs with the enable inputs of the tristate elements.

(Embodiment 3)

In a third embodiment of the invention, an integrated circuit designed by the scan path method and including tristate elements is modified in its design so as to detect a fault in a logic circuit connected with the data input of a tristate element in an off-state during a test.

Figure 8:
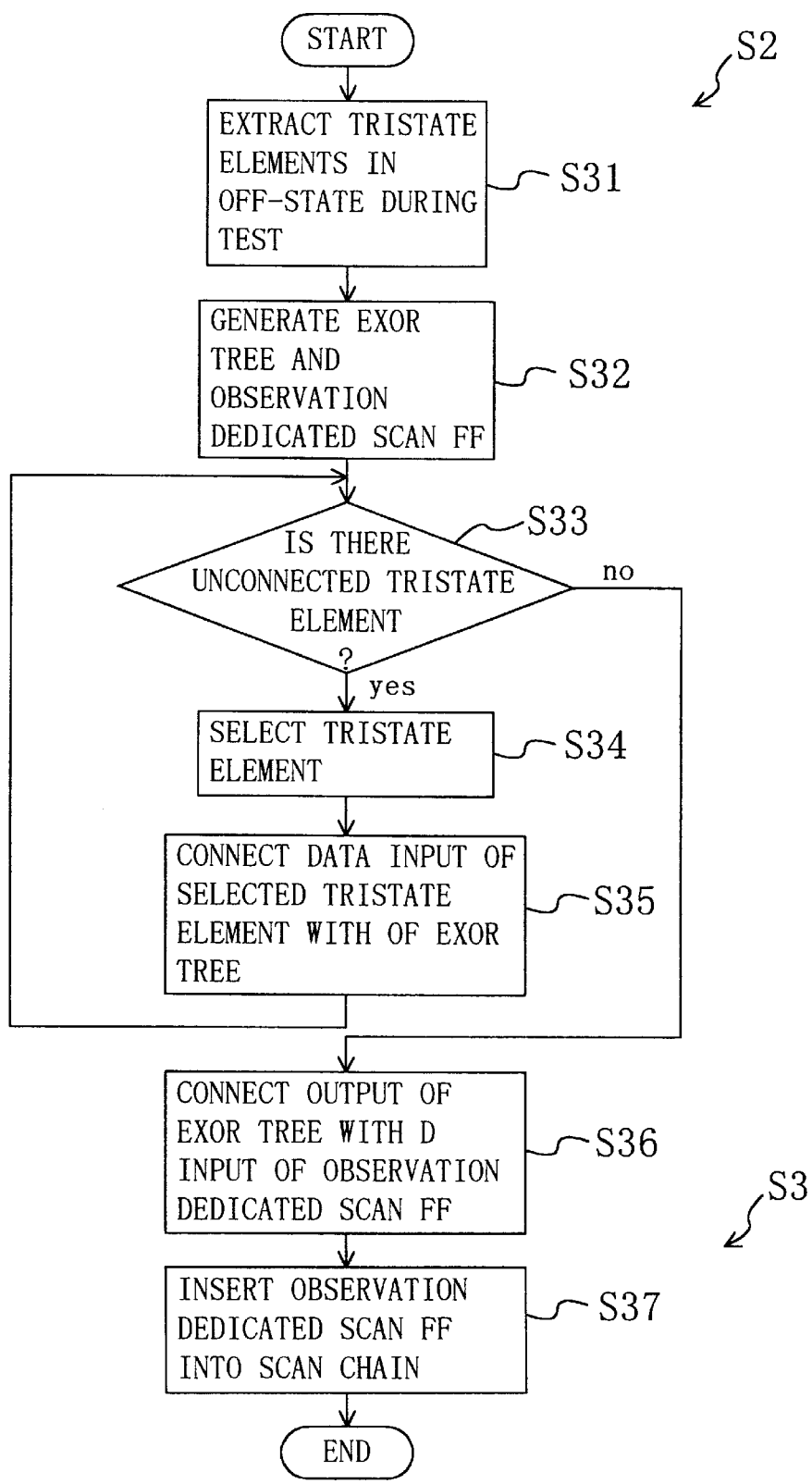
FIG. 8 is a flowchart for showing procedures in a method of design for testability according to a third embodiment of the invention.

FIG. 8 is a flowchart for showing procedures in a method of design for testability according to this embodiment, and these procedures correspond to the second and third steps S2 and S3. Steps S31 through S36 constitute the step S2, and a step S37 constitutes the third step S3.

With regard to a given integrated circuit, first in the step S31, it is distinguished whether or not each tristate element in the integrated circuit is in an off-state during the test, and all tristate elements in an off-state during the test are extracted.

Next, in the step S32, an EXOR tree having inputs in the number equal to the number of the tristate elements extracted in the step S31 and one observation dedicated scan FF are generated as an observation circuit.

Then, in the step S33, it is determined whether or not the integrated circuit includes a tristate element not connected with any of the inputs of the EXOR tree generated in the step S32. When the integrated circuit includes such a tristate element, the procedure proceeds to the step S34, and when not, the procedure proceeds to the step S36.

In the step S34, one tristate element not connected with any of the inputs of the EXOR tree is selected. Then in the step S35, the data input of the tristate element selected in the step S34 is connected with one input of the EXOR tree generated in the step S32. By repeating the procedures of the steps S33 through S35, the data inputs of all the tristate elements extracted in the step S31 are connected with the inputs of the EXOR tree generated in the step S32.

Next, in the step S36, the output of the EXOR tree generated in the step S32 is connected with the ordinary data input of the observation dedicated scan FF generated in the step S32. Ultimately, in the step S37, the observation dedicated scan FF is inserted into an arbitrary position in a scan chain already formed in the first step S1.

Now, the method of design for testability according to this embodiment will be described in detail by exemplifying a simple circuit.

Figure 9:
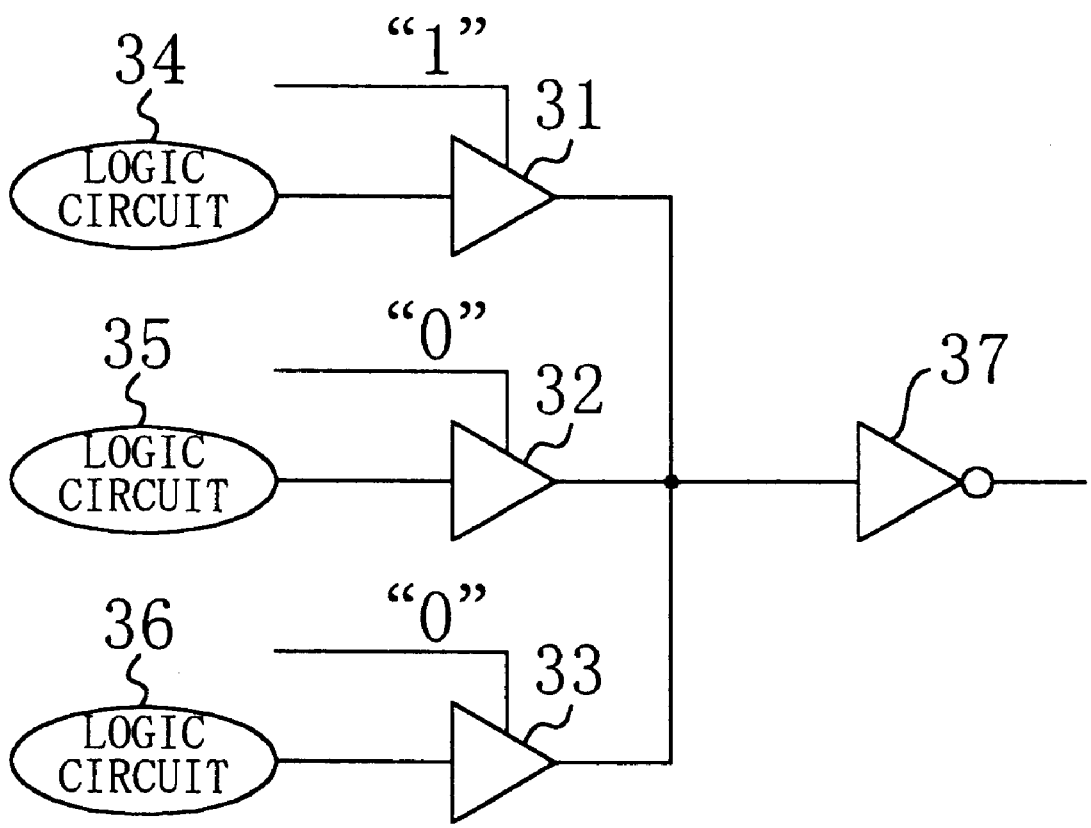
FIG. 9 illustrates the method of design for testability according to the third embodiment and is a circuit diagram of a circuit to be designed for testability.
Figure 10:
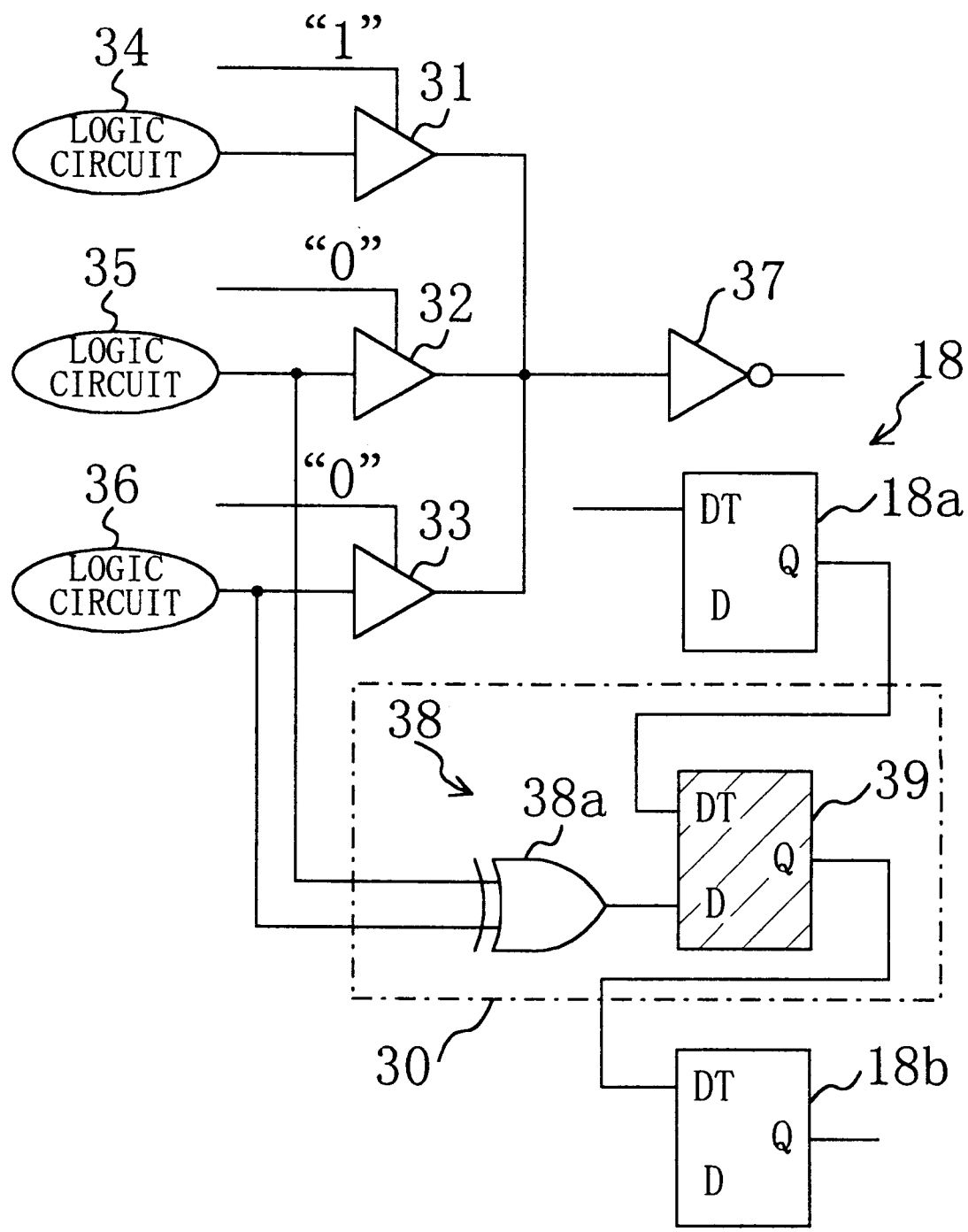
FIG. 10 illustrates the method of design for testability according to the third embodiment and is a circuit diagram of a circuit obtained from the circuit of FIG. 9 by the method of design for testability of the third embodiment.

FIGS. 9 and 10 are diagrams for illustrating the method of design for testability of this embodiment, wherein FIG. 9 shows a circuit to be designed for testability and FIG. 10 shows a circuit obtained from the circuit of FIG. 9 through the design for testability by the method of design for testability of this embodiment.

In FIG. 9, reference numerals 31, 32 and 33 denote tristate elements, and reference numerals 34, 35 and 36 denote logic circuits connected with the data inputs of the tristate elements 31, 32 and 33, respectively. In the circuit of FIG. 9, it is assumed that the tristate element 31 alone is in an on-state and the tristate elements 32 and 33 are in an off-state during the test. Specifically, when the circuit of FIG. 9 is tested, the enable input of the tristate element 31 is supplied with a logic value "1", while the enable inputs of the tristate elements 32 and 33 are supplied with a logic value "0".

With regard to the circuit of FIG. 9, first in the step S31, the tristate elements 32 and 33, which are in an off-state during the test, are extracted.

Next, in the step S32, an observation circuit 30 including an EXOR tree 38 and an observation dedicated scan FF 39 is generated. At this point, since the two tristate elements 32 and 33 are extracted in the step S31, the EXOR tree 38 has two inputs, namely, the EXOR tree 38 is constituted by one EXOR gate 38a.

Then, in the steps S33 through S35, the data inputs of the tristate elements 32 and 33 are connected with the inputs of the EXOR tree 38. Then, in the step S36, the output of the EXOR tree 38 is connected with the ordinary data input of the observation dedicated scan FF 39.

Ultimately, in the step S37, the observation dedicated scan FF 39 is inserted into an existing scan chain 18 including scan FFs 18a and 18b. As is shown in FIG. 10, the output Q of the scan FF 18a is disconnected from the test data input DT of the scan FF 18b, the output Q of the scan FF 18a is connected with the test data input DT of the observation dedicated scan FF 39, and the output Q of the observation dedicated scan FF 39 is connected with the test data input DT of the scan FF 18b.

In the circuit of FIG. 10 thus modified in its design, faults in the logic circuits 35 and 36 can be observed at an external output pin through the observation dedicated scan FF 39 and the existing scan chain 18.

As described above, according to the method of design for testability of this embodiment, the data inputs of the tristate elements in an off-state during the test are connected with the inputs of the EXOR tree, and the output of the EXOR tree is connected with the existing scan chain through the observation dedicated scan FF. In this manner, faults in the logic circuits connected with the data inputs of the tristate elements in an off-state during the test alone, which cannot be conventionally detected, can be observed at the external output pin. As a result, the fault coverage of the integrated circuit can be improved.

(Embodiment 4)

In a fourth embodiment of this invention, an integrated circuit designed by the scan path method and including tristate elements is modified in its design so as to detect a fault in logic circuits connected with the data inputs of the tristate elements in an off-state during a test, similarly to the third embodiment.

Figure 11:
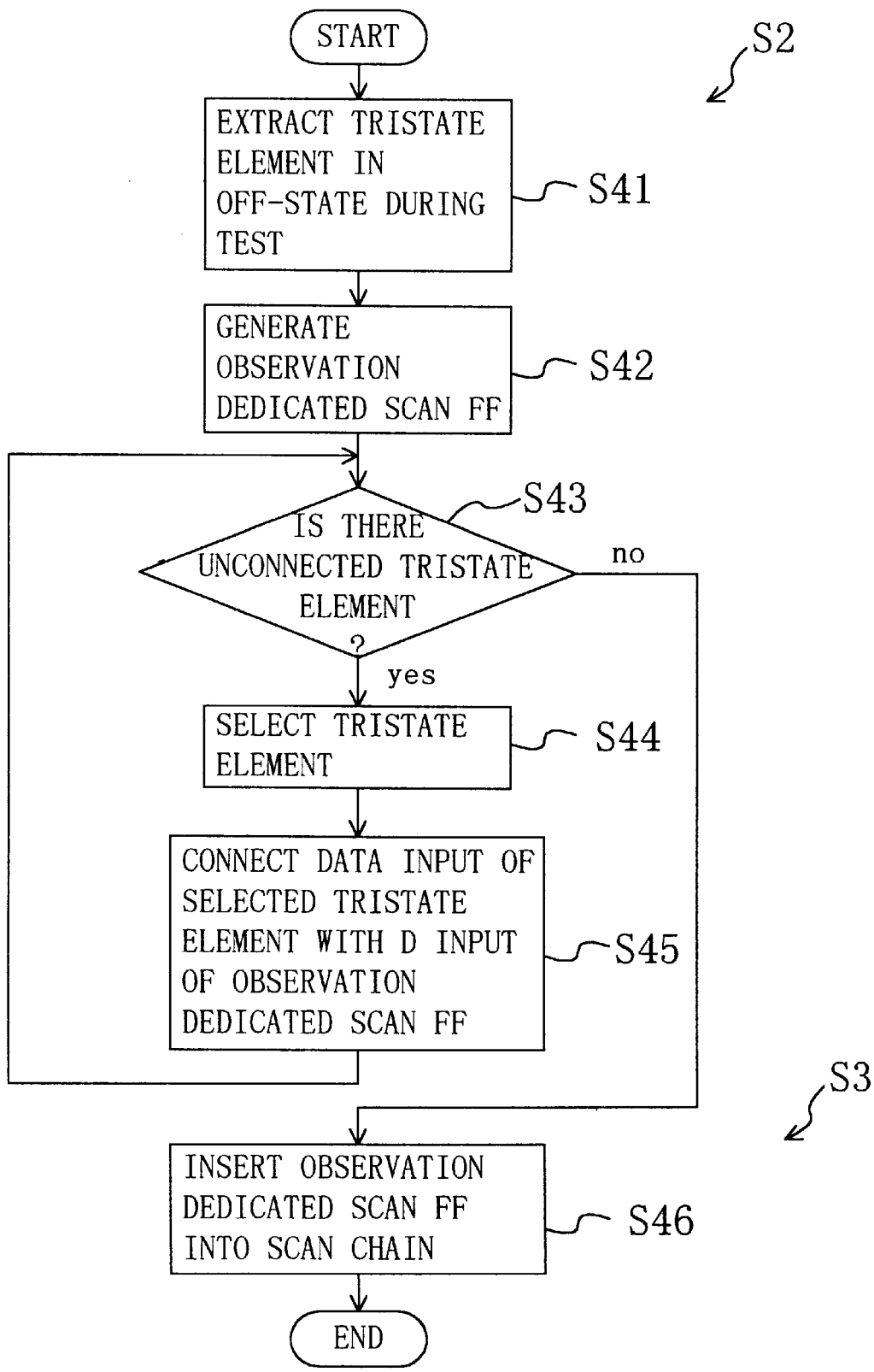
FIG. 11 is a flowchart for showing procedures in a method of design for testability according to a fourth embodiment of the invention.

FIG. 11 is a flowchart for showing procedures in a method of design for testability of this embodiment, and these procedures correspond to the second and third steps S2 and S3. Steps S41 through S45 constitute the second step S2, and a step S46 constitutes the third step S3.

With regard to a given integrated circuit, first in the step S41, it is distinguished whether or not each tristate element included in the integrated circuit is in an off-state during the test, and all tristate elements in an off-state during the test are extracted.

Next, in the step S42, observation dedicated scan FFs in the number equal to the number of the tristate elements extracted in the step S41 are generated as an observation circuit.

In the step S43, it is determined whether or not the integrated circuit includes a tristate element not connected with any of the observation dedicated scan FFs generated in the step S42. When the integrated circuit includes such a tristate element, the procedure proceeds to the step S44, and when not, the procedure proceeds to the step S46.

In the step S44, one tristate element not connected with any of the observation dedicated scan FFs generated in the step S42 is selected. Then, in the step S45, the data input of the tristate element selected in the step S44 is connected with the ordinary data input of one of the observation dedicated scan FFs generated in the step S42 not connected with any tristate element. By repeating the procedures of the steps S43 through S45, the data inputs of the all the tristate elements extracted in the step S41 are connected with the ordinary data inputs of the observation dedicated scan FFs generated in the step S42.

Ultimately, in the step S46, the observation dedicated scan FFs are inserted into an arbitrary position in a scan chain already formed in the first step S1.

Now, the method of design for testability of this embodiment will be described in detail by exemplifying the circuit of FIG. 9.

Figure 12:
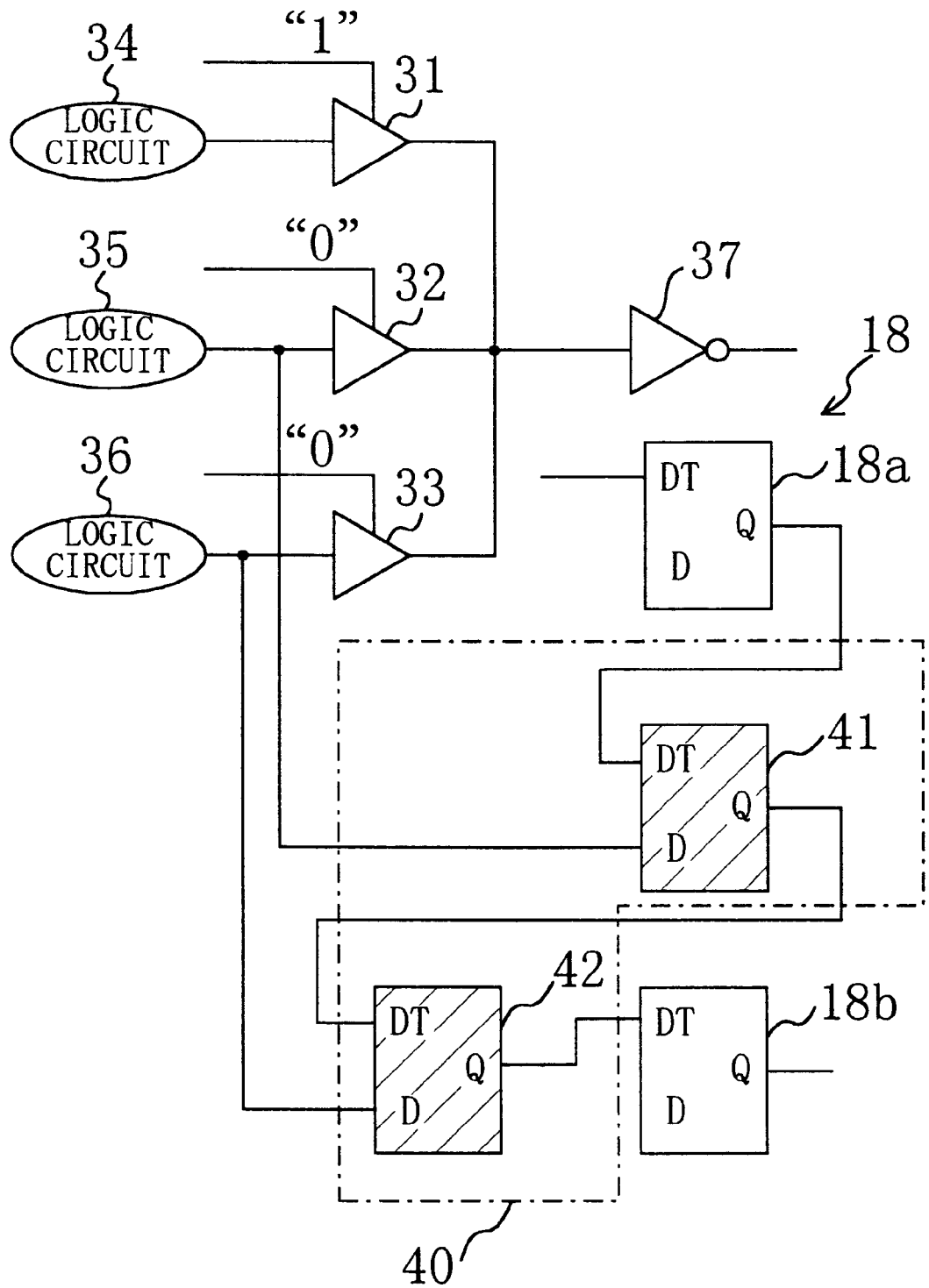
FIG. 12 illustrates the method of design for testability of the fourth embodiment and is a circuit diagram of a circuit obtained from the circuit of FIG. 9 by the method of design for testability of the fourth embodiment.

FIG. 12 is a circuit diagram of a circuit obtained from the circuit of FIG. 9 through the design for testability by the method of design for testability of this embodiment.

With regard to the circuit of FIG. 9, first in the step S41, the tristate elements 32 and 33, which are in an off-state during the test, are extracted.

Next, in the step S42, an observation circuit 40 including observation dedicated scan FFs 41 and 42 is generated. Since the two tristate elements 32 and 33 are extracted in the step S41, the two observation dedicated scan FFs 41 and 42 are generated at this point.

Then, in the steps S43 through S45, the data inputs of the tristate elements 32 and 33 are connected with the ordinary data inputs D of the observation dedicated scan FFs 41 and 42, respectively.

Ultimately, in the step S46, the observation dedicated scan FFs 41 and 42 are inserted into an existing scan chain 18 including scan FFs 18a and 18b. As is shown in FIG. 12, the output Q of the scan FF 18a is disconnected from the test data input DT of the scan FF 18b, the output Q of the scan FF 18a is connected with the test data input DT of the observation dedicated scan FF 41, the output Q of the observation dedicated scan FF 41 is connected with the test data input DT of the observation dedicated scan FF 42, and the output Q of the observation dedicated scan FF 42 is connected with the test data input DT of the scan FF 18b.

In the circuit of FIG. 12 thus modified in its design, a fault in logic circuits 35 and 36 can be observed at an external output pin through the observation dedicated scan FFs 41 and 42 and the scan chain 18.

As described above, according to the method of design for testability of this embodiment, the data inputs of the tristate elements in an off-state during the test are connected with the ordinary data inputs of the observation dedicated scan FFs, so that a fault in the logic circuits connected with the data inputs the tristate elements in an off-state during the test alone, which cannot conventionally detected, can be observed from the external output pin. As a result, the fault coverage of the integrated circuit can be improved.

It is noted that the method of design for testability of this invention is not only applicable to a fault of a portion concerned with data input or enable input of the tristate element as described in the first through fourth embodiments but also applicable to a fault of other portions difficult to test, namely, an untestable fault or an undetected fault.

Figure 13:
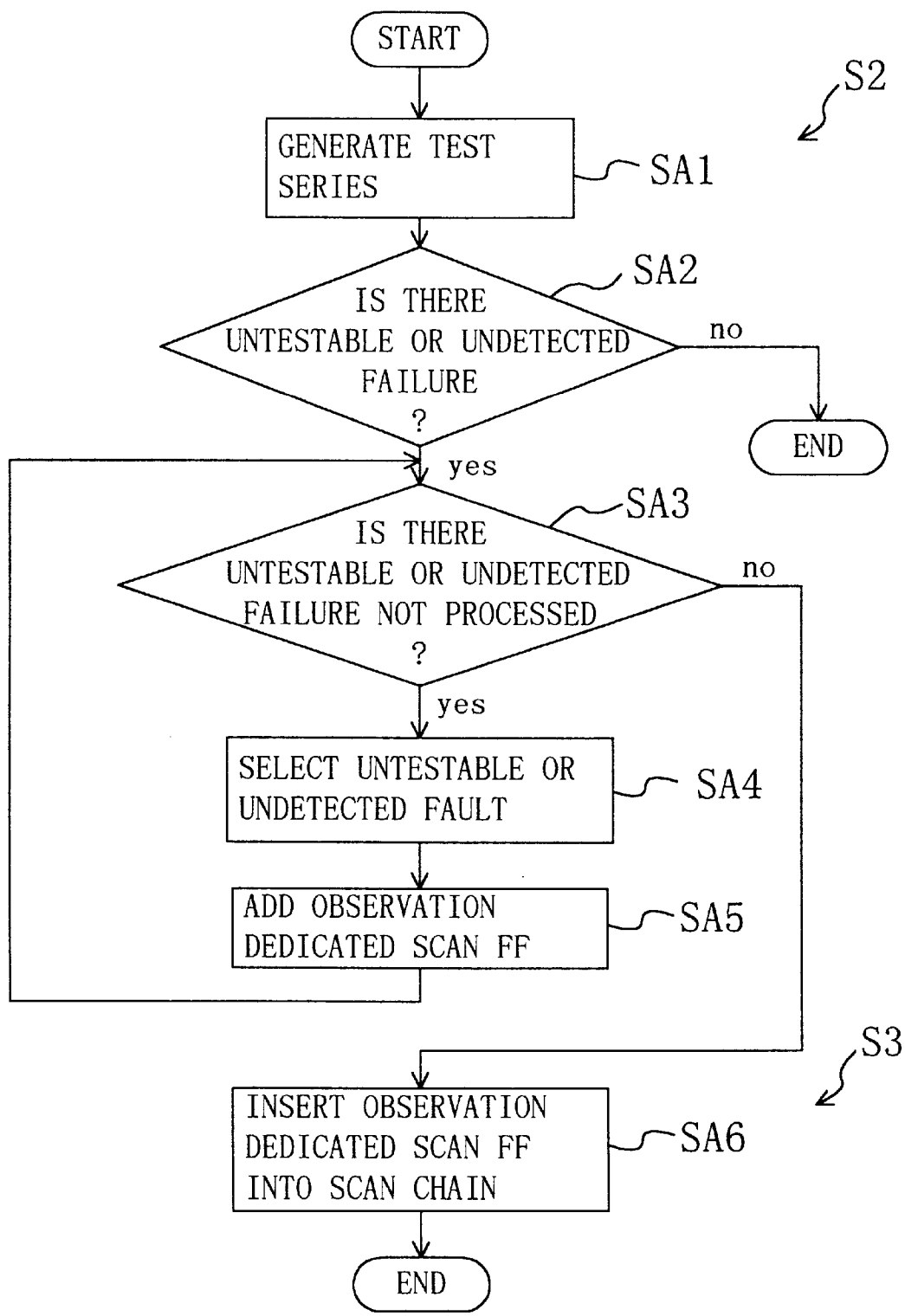
FIG. 13 is a flowchart for showing procedures in a method of design for testability according to the invention adopted for detecting an untestable fault or an undetected fault.

FIG. 13 is a flowchart for showing procedures in a method of design for testability according to the invention applicable to an untestable or undetected fault. Steps SA1 through SA5 constitute the second step S2, and a step SA6 constitutes the third step S3.

With regard to a given integrated circuit, first in the step SA1, a test sequence is generated. Then, in the step SA2, it is determined whether or not the integrated circuit has an untestable fault or an undetected fault. When the integrated circuit does not have such a fault, the procedure is completed, and when it does, the procedure proceeds to the step SA3.

In the steps SA3 through SA5, an observation dedicated scan FF is added to the untestable fault or the undetected fault in the integrated circuit.

Figure 14A:
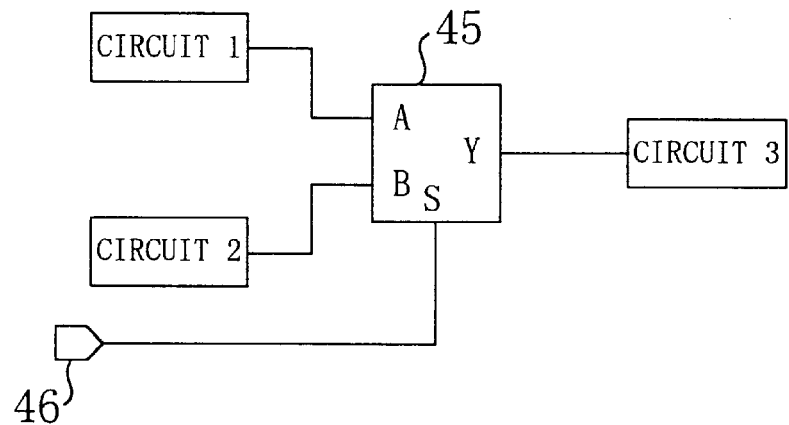
Figure 14B:
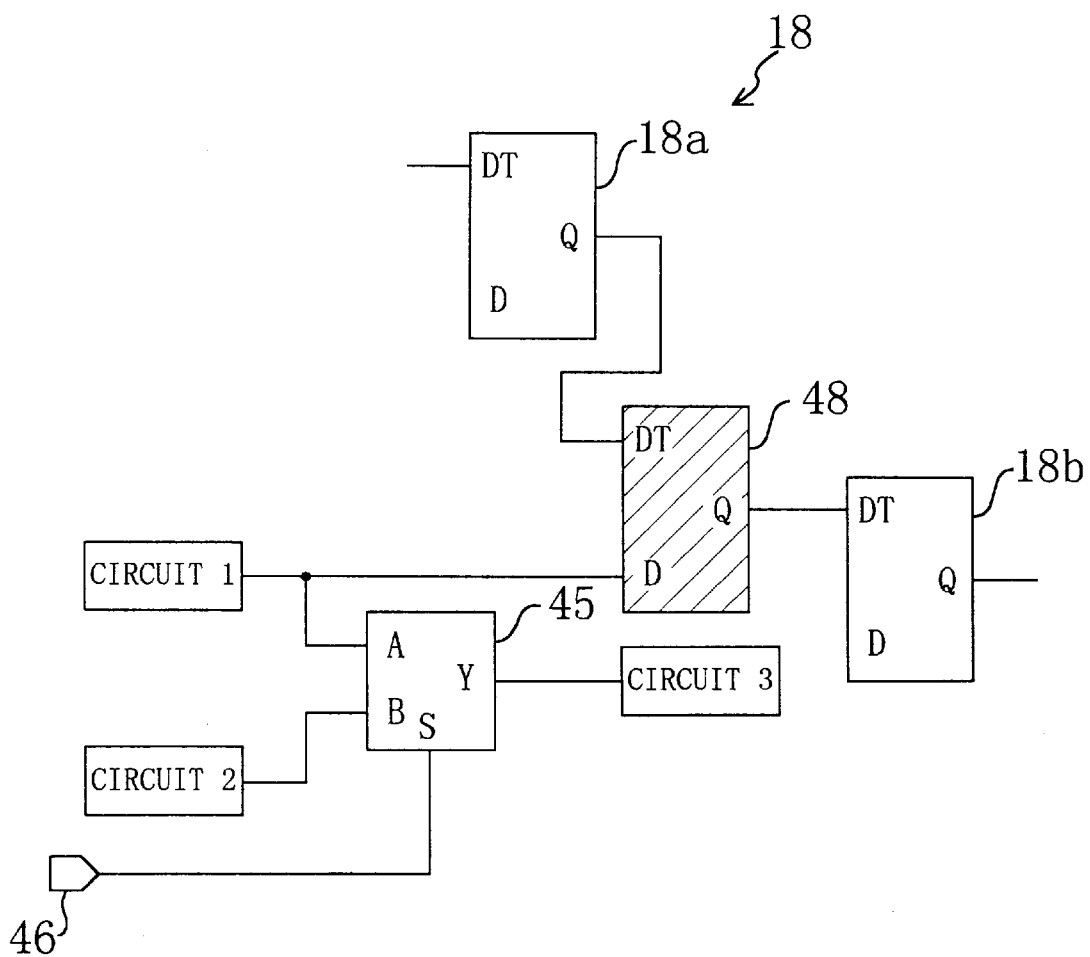

FIGS. 14(a) and 14(b) are diagrams for illustrating the method of design for testability of this invention applicable to an untestable or undetected fault, wherein FIG. 14(a) shows an example of a circuit having an untestable fault and FIG. 14(b) shows a circuit obtained from the circuit of FIG. 14(b) by the method of design for testability.

In FIG. 14(a), a selector 45 selects one of the output signals of circuits 1 and 2 in accordance with a signal entering an external input terminal 46, and outputs the selected signal to a circuit 3. At this point, when the input signal at the external input pin 46 is assumed to be fixed at a logic value for selecting the output signal of the circuit 2 by the selector 45 during a test of the circuits, a fault in the circuit 1 cannot be detected, namely, the fault in the circuit 1 is untestable.

Therefore, in order to make the circuit 1 testable, an observation dedicated scan FF 48 is added as is shown in FIG. 14(b), and the output line of the circuit 1 is connected with the ordinary data input D of the observation dedicated scan FF 48.

Ultimately, in the step SA6, the added observation dedicated scan FF 48 is inserted into a scan chain 18 already existing in the integrated circuit. As a result, the untestable fault can be tested through the scan chain 18.

In stead of directly connecting the observation dedicated scan FF with the portion having the untestable fault, an EXOR tree can be interposed as in the first or the third embodiment. It goes without saying that another combinational circuit having plural inputs and one output can be interposed instead.

Now, allocation of observation dedicated scan FFs to scan chains in the third step S3 will be described.

In the third step S3, the observation dedicated scan FFs of the observation circuit added in the second step S2 are inserted into a scan chain formed in the first step S1. However, since plural scan chains are actually formed by the scan path method, it is necessary to decide which scan chain each observation dedicated scan FF is inserted into in the third step S3.

On the other hand, the number of test patterns required for testing an integrated circuit designed by the scan path method depends upon the maximum number of the scan FFs included in the respective scan chains. Specifically, as the maximum number of the scan FFs included in the scan chains is larger, the number of the test patterns required for the test is larger. Accordingly, the observation dedicated scan FFs are allocated to the scan chains at this point so as to suppress the increase of the number of the test patterns required for the test.

It is assumed that three scan chains CA, CB and CC are formed in the integrated circuit by the scan path method, and each scan chain is assumed to include scan FFs in the following number:

Scan chain CA: 500
Scan chain CB: 450
Scan chain CC: 480

In such a case, the observation dedicated scan FFs to be inserted are allocated in accordance with their number as follows:

(A) In the case where the number of the observation dedicated scan FFs does not exceeds seventy:

The observation dedicated scan FFs are inserted so that the maximum number of the scan FFs included in the respective scan chains cannot be varied. For example, when the number of the observation dedicated scan FFs is sixty, the fifty observation dedicated scan FFs are inserted into the scan chain CB, and the remaining ten observation dedicated scan FFs are inserted into the scan chain CC. Thus, the maximum number of the scan FFs included in the respective scan chains is not changed but remains to be 500, and hence, the number of the test patterns required for the test does not increase.

(B) In the case where the number of the observation dedicated scan FFs exceeds seventy:

The observation dedicated scan FFs are inserted so as to equalize the numbers of scan FFs in the respective scan chains. Specifically, the sum of the total number of scan FFs included in the scan chains CA, CB and CC (namely, 1430=500+450+ 480) and the number of the observation dedicated scan FFs is divided by the number of the scan chains, so that the quotient can be the number of the scan FFs including the observation dedicated scan FFs in each scan chain. For example, when the number of the observation dedicated scan FFs is 130, the quotient is 520 (namely, (1430+130)/3). Therefore, the twenty observation dedicated scan FFs are inserted into the scan chain CA, the seventy observation dedicated scan FFs are inserted into the scan chain CB and the forty observation dedicated scan FFs are inserted into the scan chain CC. Thus, the numbers of the scan FFs included in the respective scan chains are equalized to be 520. As a result, the increase of the maximum number of the scan FFs included in the respective scan chains can be suppressed to the minimum 20, namely, the increase of the number of the test patterns required for the test can be minimized.

Figure 15:
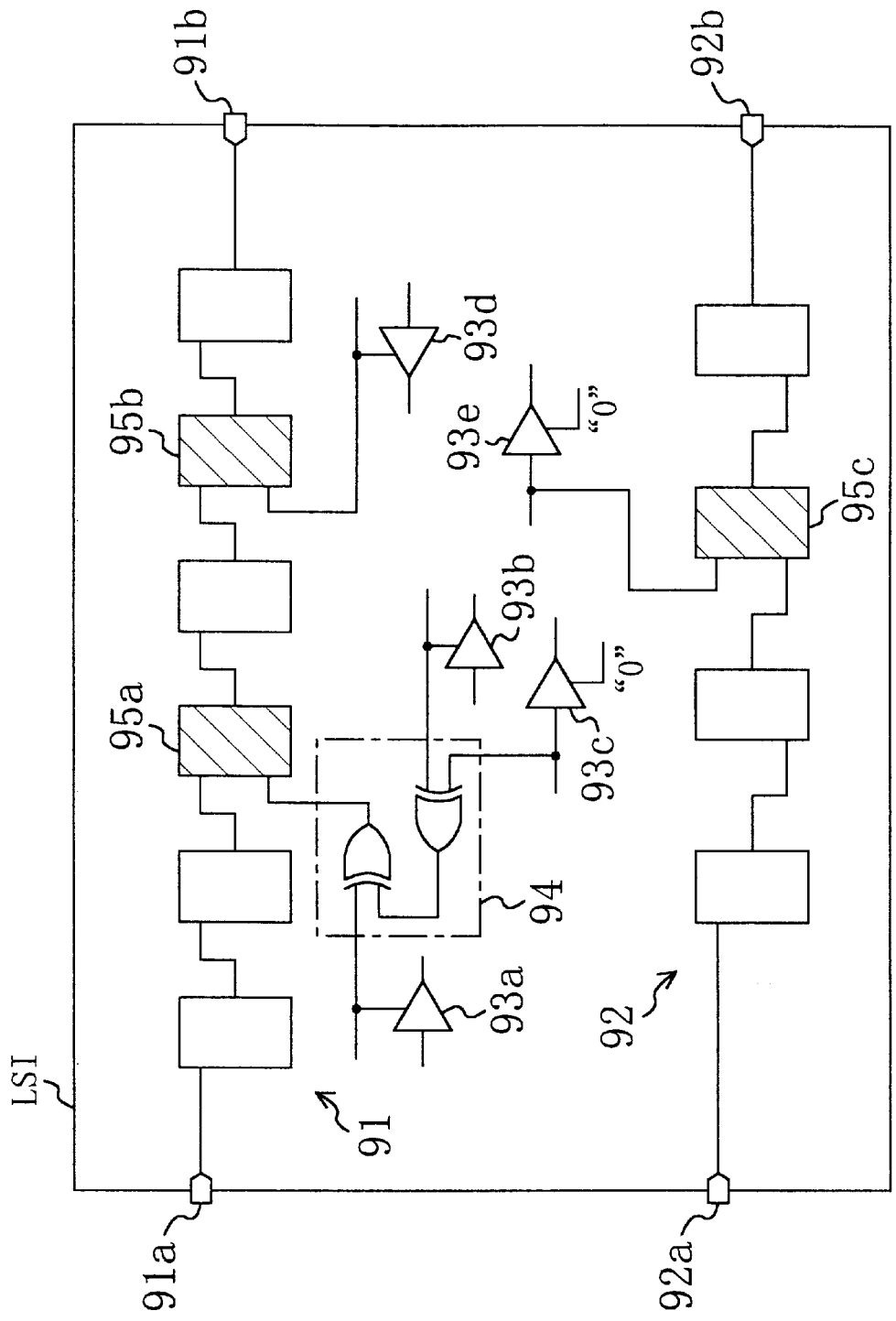
FIG. 15 is a schematic diagram for showing the configuration of an integrated circuit resulting from design for testability carried out by the method of design for testability of the invention.

FIG. 15 is a schematic circuit diagram for showing the configuration of an integrated circuit obtained through the design for testability carried out by the method of design for testability of this invention. In FIG. 15, a reference numeral 91 denotes a scan chain formed between external pins 91*a* and 91*b*, a reference numeral 92 denotes a scan chain formed between external pins 92*a* and 92*b*, and reference numerals 93*a* through 93*e* denote tristate elements. The enable inputs of the tristate elements 93*c* and 93*e* are set at "0" during the test. Observation dedicated scan FFs 95*a* and 95*b* are inserted into the scan chain 91, and an observation dedicated scan FF 95*c* is inserted into the scan chain 92.

The observation dedicated scan FF 95*a* receives an output signal of an EXOR tree 94, and the EXOR tree 94 receives enable input signals of the tristate elements 93*a* and 93*b* and a data input signal of the tristate element 93*c*. Also, the observation dedicated scan FF 95*b* receives an enable input signal of the tristate element 93*d*, and the observation dedicated scan FF 95*c* receives a data input signal of the tristate element 93*e*.

(Embodiment 5)

In a fifth embodiment of the invention, description will be given on a method of design for avoiding a bus error, in which a bus error can be definitely avoided when data outputs of plural tristate elements controlled by scan FFs are connected with a common bus in an integrated circuit.

Figure 16:
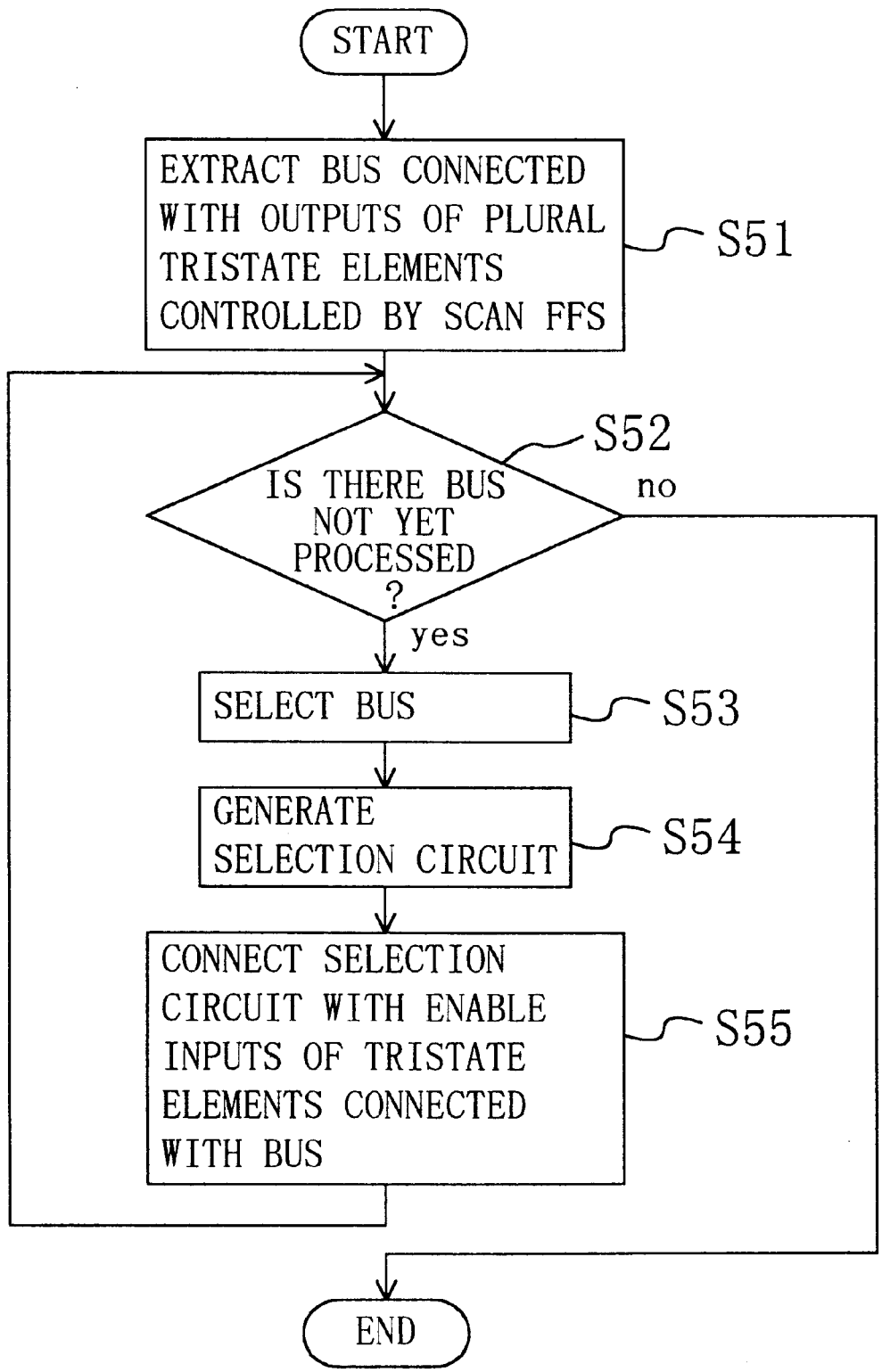
FIG. 16 is a flowchart for showing procedures in a method of design for avoiding a bus error according to a fifth embodiment of the invention.

FIG. 16 is a flowchart for showing procedures in the method of design for avoiding a bus error according to the fifth embodiment of the invention.

With regard to a given integrated circuit, first in a step S51, it is determined whether or not the enable input of each tristate element included in the integrated circuit is controlled by a scan FF, and a bus connected with the data outputs of plural tristate elements whose enable inputs are controlled by the scan FFs is extracted.

Next, in a step S52, it is determined whether or not any bus extracted in the step S52 is not yet processed for avoiding a bus error. When there is a bus not yet processed, the procedure proceeds to a step S53, and when all buses are processed, the procedure is completed.

In the step S53, one bus not yet processed for avoiding a bus error is selected. In a step S54, with regard to the bus selected in the step S53, a selection circuit for controlling the enable inputs of the tristate elements connected with the bus is generated so that merely one of the tristate elements can be in an on-state during the test. Then, in a step S55, the selection circuit generated in the step S54 is connected with the enable inputs of the tristate elements connected with the bus selected in the step S53.

Now, the method of design for avoiding a bus error of this embodiment will be described in detail by exemplifying a simple circuit.

Figure 17A:
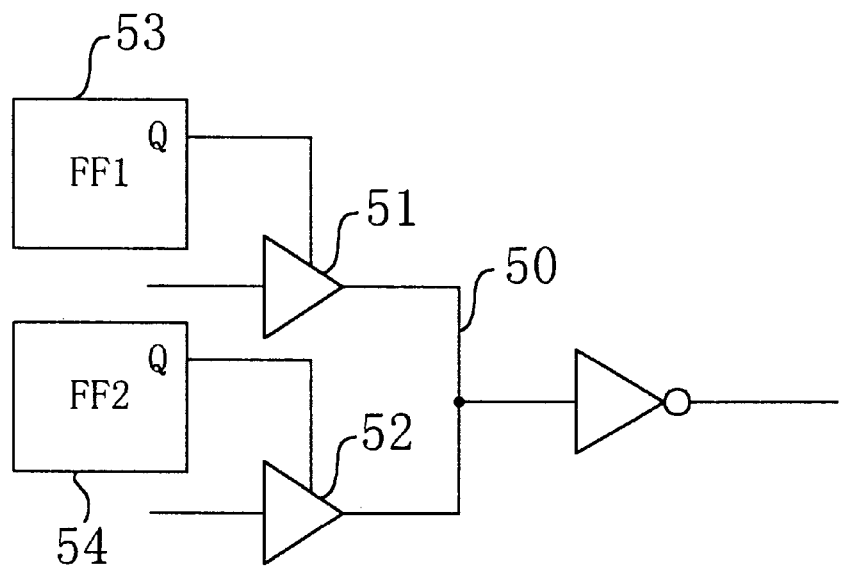
Figure 17B:
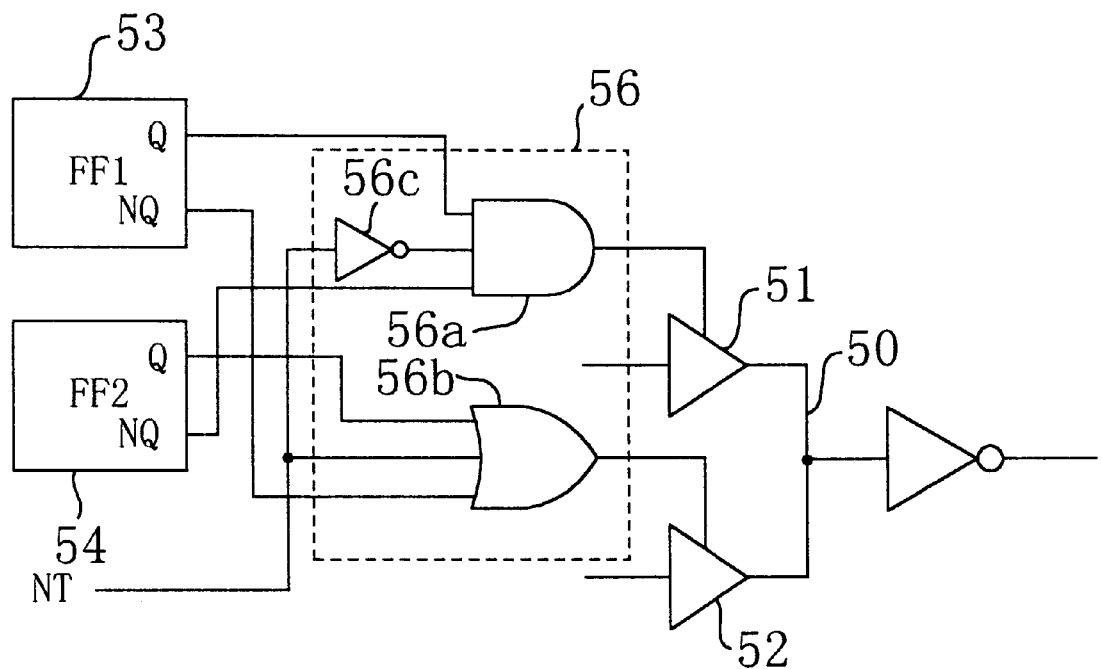

FIGS. 17(*a*) and 17(*b*) are diagrams for illustrating the method of design for avoiding a bus error of this embodiment, wherein FIG. 17(*a*) is a circuit diagram of a circuit having a possibility of occurrence of a bus error and FIG. 17(*b*) is a circuit diagram of a circuit obtained from the circuit of FIG. 17(*a*) through the bus error avoidance by the method of design for avoiding a bus error of this embodiment. In FIG. 17(*a*), reference numerals 51 and 52 denote tristate elements commonly connected with a bus 50 at their data outputs, and reference numerals 53 and 54 denote scan FFs for controlling the enable inputs of the tristate elements 51 and 52, respectively.

With regard to the circuit of FIG. 17(*a*), first in the step S51, the bus 50, which is commonly connected with the data input of the tristate element 51 whose enable input is controlled by the scan FF 53 and the data output of the tristate element 52 whose enable input is controlled by the scan FF 54, is extracted.

Then, in the procedures of the steps S52 through S55, a selection circuit 56 is generated and connected with the enable inputs of the tristate elements 51 and 52. The selection circuit 56 includes a 3-input AND gate 56*a*, a 3-input OR gate 56*b* and an inverter 56*c*. The selection circuit 56 receives a mode switching signal NT for the scan FFs, and controls the enable inputs of the tristate elements 51 and 52, so that the tristate element 51 can be in an off-state and the tristate element 52 can be in an on-state during the shift operation of the scan FFs 53 and 54.

Figure 18A:
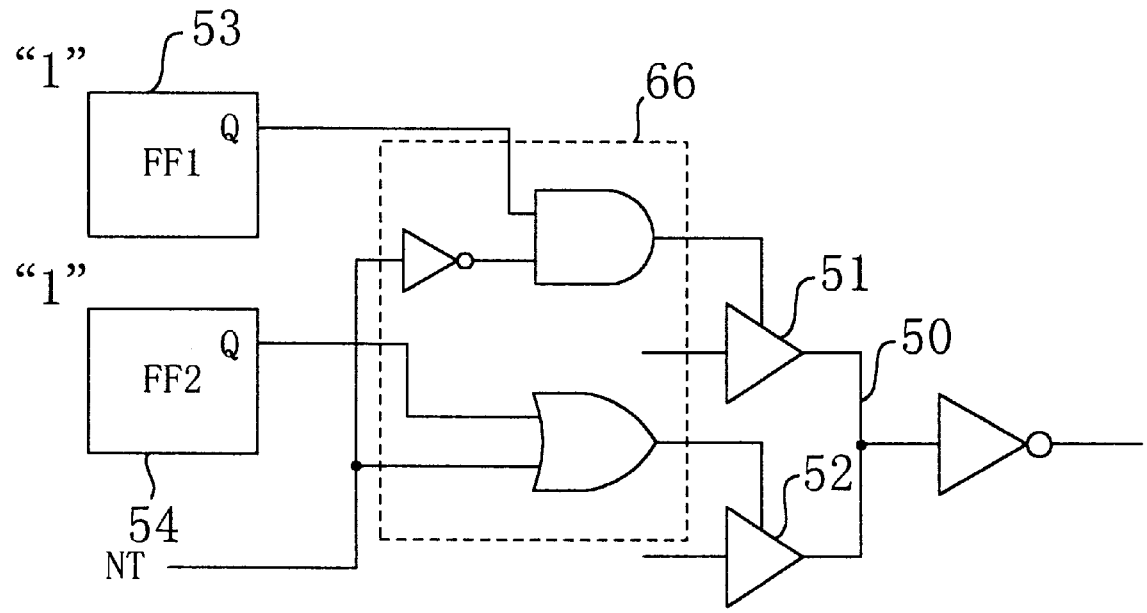
Figure 18B:
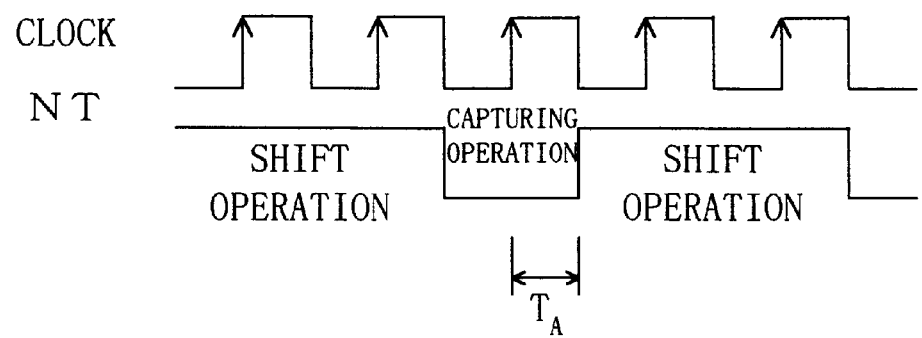
Figures 19A, 19B:
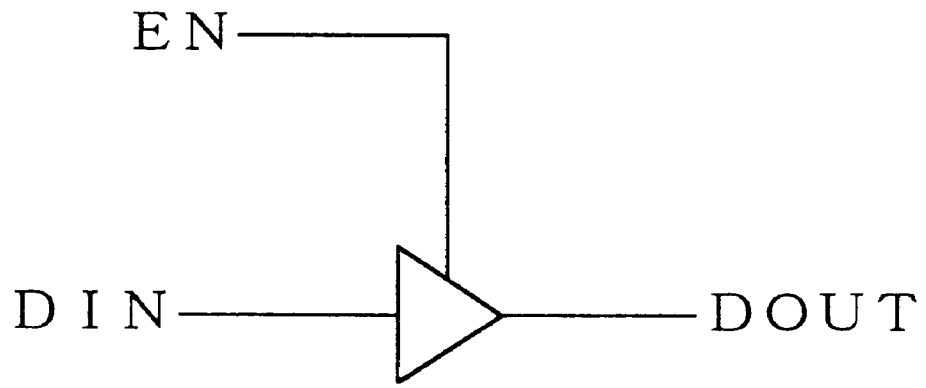

FIG. 18(*a*) is a circuit diagram of a circuit obtained from the circuit of FIG. 17(*a*) through the design for avoiding a bus error carried out by a conventional method (Mentor Graphics, DFT ADVISOR reference manual, ver. 8. 4. 1, Jul. 1994). In FIG. 18(*a*), a selection circuit 66 generated by the design for avoiding a bus error is inserted between the tristate elements 51 and 52 and the scan FFs 53 and 54.

The selection circuit 66 receives output data of the scan FFs 53 and 54 and a mode switching signal NT for the scan FFs, and outputs a signal to the enable inputs of the tristate elements 51 and 52. In order to avoid a bus error in the bus 50, the selection circuit 66 controls the tristate elements 51 and 52, so that the tristate element 51 can be in an off-state and the tristate element 52 can be in an on-state during the shift operation of the scan FFs 53 and 54.

However, when a circuit like the selection circuit 66 is used for avoiding a bus error, there arises the following problem: When the ordinary data inputs of the scan FFs 53 and 54 are both set at a logic value "1" at the completion of the shift operation, the logic value at the enable inputs of the tristate elements 51 and 52 is unavoidably set at "1" during a half clock (period TA) in a capturing operation carried out at a high to low transition of the mode switching signal NT as is shown in FIG. 18(*b*). As a result, a bus conflict occurs in the bus 50.

Therefore, in this embodiment, the selection circuit 56 receives positive output data Q and negative output data NQ of the respective scan FFs, so that the tristate elements 51 and 52 cannot be simultaneously in an on-state even during the ordinary operation of the scan FFs.

In the circuit of FIG. 17(*b*) thus modified in its design, a bus error such as a bus conflict and a bus float never occurs in the bus 50 during the test.

As described above, according to the method of design for avoiding a bus error of the fifth embodiment, with regard to the integrated circuit including the bus connected with the data outputs of the plural tristate elements controlled by the scan FFs, the selection circuit for controlling the enable inputs of the tristate elements is inserted so that merely one of the plural tristate elements connected with the bus can be in an on-state. As a result, a bus error can be prevented.

What is claimed is:

1. A method of design for testability of an integrated circuit comprising:

a first step of designing said integrated circuit by a scan path method for attaining testability;

a second step of adding an observation circuit, which observes a signal at a portion difficult to test or a portion impossible to test and outputs said observed signal from an observation dedicated scan flip-flop, to said integrated circuit; and a third step of inserting said observation dedicated scan flip-flop into a scan chain formed in said first step so that an output signal of said observation circuit is outputted from said integrated circuit through said scan chain.

2. The method of design for testability of claim 1, wherein said observation circuit includes a combinational circuit which receives plural signals of portions difficult to test or impossible to test as its input signals and outputs an output signal to said observation dedicated scan flip-flop, and said output signal of said combinational circuit is changed in accordance with a change of one of said input signals.

3. The method of design for testability of claim 2, wherein said combinational circuit is an EXOR tree including one exclusive OR gate or plural exclusive OR gates connected with one another in a tree-shape.

4. The method of design for testability of claim 2, wherein said output signal of said combinational circuit is changed in accordance with a change of one of said input signals when the other input signals have a predetermined value.

5. The method of design for testability of claim 1, wherein said portion difficult to test is an enable input line of a tristate element.

6. The method of design for testability of claim 1, wherein said portion difficult to test is a data input line of a tristate element which is in an off-state where no input data is output during a test of said integrated circuit.

7. The method of design for testability of claim 1, wherein said first step results in forming plural scan chains in said integrated circuit, and in said third step, said observation dedicated scan flip-flop is inserted so as not to increase the maximum of the numbers of scan flip-flops included in said respective scan chains.

8. The method of design for testability of claim 1, wherein said first step results in forming plural scan chains in said integrated circuit, and in said third step, said observation dedicated scan flip-flop is inserted so as to equalize the numbers of scan flip-flops included in said respective scan chains.

9. An integrated circuit designed by a scan path method, comprising:

an observation circuit for observing a signal present at a portion where a test is difficult or impossible, and outputting said observed signal from an observation dedicated scan flip-flop operating only during a test of said integrated circuit; and a scan chain including said observation dedicated scan flip-flop.

10. The integrated circuit of claim 9, wherein said observation dedicated scan flip-flop receives, as its ordinary data input signal, an enable input signal of a tristate element.

11. The integrated circuit of claim 9, wherein said observation dedicated scan flip-flop receives, as its ordinary data input signal, a data input signal of a tristate element which is in an off-state where no input data is output during a test of said integrated circuit.

12. The integrated circuit of claim 9, wherein said observation dedicated scan flip-flop receives, as its input signal, an output signal of a combinational circuit having plural inputs and one output, and said output signal of said combinational circuit is changed in accordance with a change of one input signal.

13. The integrated circuit of claim 12, wherein said combinational circuit is an EXOR tree including one exclusive OR gate or plural exclusive OR gates connected with one another in a tree-shape.

14. The integrated circuit of claim 12, wherein said output signal of said combinational circuit is changed in accordance with a change of one input signal when the other input signals have a predetermined value.

15. The integrated circuit of claim 12, wherein said combinational circuit receives, as its input signal, an enable input signal of a tristate element.

16. The integrated circuit of claim 12, wherein said combinational circuit receives, as its input signal, a data input signal of a tristate element which is in an off-state where no input data is output during a test of said integrated circuit.

17. A method of design for avoiding a bus error in which an integrated circuit designed by a scan path method is modified in its design for preventing a bus error, comprising:

a first process for distinguishing whether or not an enable input of a tristate element included in said integrated circuit is controlled by a scan flip-flop and for extracting, from said integrated circuit, a bus connected with data output terminals of plural tristate elements whose enable inputs are controlled by scan flip-flops;

a second process for generating, with regard to said plural tristate elements whose data output terminals are connected with said bus extracted in said first process, a selection circuit for receiving output data of said scan flip-flops controlling said enable inputs of said plural tristate elements and for controlling said enable inputs of said plural tristate elements so that merely one of said plural tristate elements is in an on-state where input data is passed through to be output during a test of said integrated circuit; and a third process for disposing said selection circuit generated in said second process in said integrated circuit and for connecting an output terminal of said selection circuit with said enable input terminals of said plural tristate elements, wherein said selection circuit generated in said second process receives, as its input signals, positive output data and negative output data of said scan flip-flops controlling said enable inputs of said plural tristate elements.

18. An integrated circuit designed by a scan path method and modified in its design for avoiding a bus error, comprising:

a plurality of tristate elements connected with a common bus at their data output terminals;

a plurality of scan flip-flops associated with said tristate elements respectively; and a selection circuit for receiving both positive output data and negative output data of each of the scan flip-flops, and controlling based on received data, enable inputs of said tristate elements so that only one of said tristate elements is in an on-state where input data is passed through to be output during a test of said integrated circuit.

* * * * *